United States Patent
Ozasa et al.

(10) Patent No.: US 7,528,625 B2
(45) Date of Patent: May 5, 2009

(54) IMAGE FORMING APPARATUS

(75) Inventors: Dan Ozasa, Kanagawa (JP); Masaaki Ishida, Kanagawa (JP); Yasuhiro Nihei, Kanagawa (JP); Atsufumi Omori, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 697 days.

(21) Appl. No.: 11/204,183

(22) Filed: Aug. 16, 2005

(65) Prior Publication Data

US 2006/0049893 A1     Mar. 9, 2006

(30) Foreign Application Priority Data

Aug. 24, 2004   (JP)   ............................. 2004-243447
Oct. 25, 2004   (JP)   ............................. 2004-309513

(51) Int. Cl.
*H03K 17/16*   (2006.01)
(52) U.S. Cl. .......................................... 326/30; 326/26
(58) Field of Classification Search ................... 326/26, 326/21–27, 30, 82–87
See application file for complete search history.

(56) References Cited

U.S. PATENT DOCUMENTS

| | | | |
|---|---|---|---|
| 6,188,237 B1 * | 2/2001 | Suzuki et al. | 326/30 |
| 6,424,169 B1 * | 7/2002 | Partow et al. | 326/30 |
| 6,552,565 B2 * | 4/2003 | Chang et al. | 326/30 |
| 6,919,738 B2 * | 7/2005 | Kushida | 326/82 |

FOREIGN PATENT DOCUMENTS

| | | |
|---|---|---|
| JP | 2002-324937 | 11/2002 |
| JP | 3558054 | 5/2004 |

* cited by examiner

*Primary Examiner*—Don P Le
(74) *Attorney, Agent, or Firm*—Oblon, Spivak, McClelland, Maier & Neustadt, P.C.

(57) ABSTRACT

An output device is disclosed that includes an impedance matching section including an impedance adjustment section, and a dummy circuit section having the same configuration as the impedance adjustment section and adapted to calculate an adjustment value for matching an output impedance to a characteristic impedance of the transmission line. The impedance matching section sets the adjustment value to an impedance adjustment section, thereby matching the output impedance to the characteristic impedance. The output device further includes a switching transistor configured to be turned on/off so as to switch the output between an H level and an L level, and a constant current driver configured to add a constant current to the output.

31 Claims, 15 Drawing Sheets

TO SWITCHING
TRANSISTOR 2N

IMAGE FORMING APPARATUS

BACKGROUND OF THE INVENTION

1. Field of the Invention

The present invention relates to an output device, a differential output device, a semiconductor laser modulation drive device, an image forming apparatus, and an electronic device that are applicable to high-speed electrical signal transmission; and particularly relates to an output device and a differential output device that are applicable to high-speed electrical signal transmission and are provided with an impedance matching section for preventing impedance mismatch, which causes signal waveform distortion, between a transmission line and a transmitter in electrical signal transmission between integrated circuits (ICs) or between printed circuit boards (PCBs); and a semiconductor laser modulation drive device, an image forming apparatus, and an electronic device that use these output devices.

The present invention further relates to an impedance matching device for preventing impedance mismatch, which causes signal waveform distortion, between a transmission line and a transmitter or a receiver in high-speed electrical signal transmission between integrated circuits; and a semiconductor laser modulation drive device and an image forming apparatus that use the impedance matching device.

2. Description of the Related Art

In order to prevent transmission signals output from an electronic circuit of, for example, an output driver of an integrated circuit, from having waveform distortion due to reflection while being transmitted through a transmission line, impedance matching between an output impedance of the circuit and a characteristic impedance of the transmission line is implemented. Conventionally, termination resistors have been used for such impedance matching.

Simple termination resistors, however, cannot accurately match the impedances due to a process variation. As the transmission speed has increased, problems such as waveform distortion and signal attenuation have arisen due to mismatched impedances. Patent Document 1 discloses a method for accurately matching impedances, wherein the voltage of a transmission line is monitored so as to compare a transition time from an L level to an H level to a reference time, and a comparison result is fed back to a variable resistor used as a termination resistor. Patent Document 2 discloses an impedance matching method for preventing waveform distortion in electrical signal transmission between a semiconductor laser drive section and a semiconductor laser control section.

[Patent Document 1] Japanese Patent Laid-Open Publication No. 2003-8421

[Patent Document 2] Japanese Patent Laid-Open Publication No. 2002-324937

However, with further improvement in transmission speed, if a comparator is connected to an output terminal for monitoring transmission signals, the output waveform is distorted because of the capacitance. This may prevent increasing the transmission speed. Also, time measurement and voltage comparison may result in increasing the size and consumption current of an impedance matching circuit. If a simple switching circuit is used as an output device, the switching speed is determined by a product CR time constant of an output impedance R and a load capacity C and, therefore, a further speed improvement cannot be achieved. Another issue involved in increasing the speed is that because inductance components of an output terminal attenuate signals, it is impossible to transmit a desired output swing.

SUMMARY OF THE INVENTION

It is a general object of the present invention to solve at least one problem described above.

More specifically, it is an object of the present invention to adjust, with a simple configuration, an output impedance of an output section to a desired value regardless of a variation of elements while achieving high-speed signal transmission.

It is another object of the present invention to provide an impedance matching device with a simple configuration suitable for high-speed transmission; a semiconductor laser modulation drive device and an image forming apparatus that use the impedance matching device.

According to an aspect of the present invention, there is provided an output device that outputs a transmission signal to a transmission line, comprising: an impedance matching section including an impedance adjustment section, and a dummy circuit section having the same configuration as the impedance adjustment section and adapted to calculate an adjustment value for matching an output impedance to a characteristic impedance of the transmission line, the impedance matching section being configured to set the adjustment value calculated by the dummy circuit section to the impedance adjustment section to match the output impedance to the characteristic impedance; a switching transistor connected in series to the impedance matching section and configured to be turned on/off so as to switch an output between an H level and an L level; and a constant current driver configured to add a constant current to the output.

In the output device, it is preferable that the impedance adjustment section include a variable resistance section to adjust a combined resistance.

It is also preferable that the variable resistance section include a plurality of resistors and a plurality of transistors.

It is also preferable that the resistors be connected in parallel, and the variable resistance section be configured to adjust a combined impedance to a desired impedance by selecting the resistors with switching on/off the transistor.

It is also preferable that the variable resistance section include a resistor and a transistor connected in series to the resistor and be configured to adjust a combined impedance to a desired impedance by adjusting a gate voltage of the transistor.

It is also preferable that the dummy circuit section include: a dummy variable resistance section having the same configuration and size as the variable resistance section; a dummy transistor having the same configuration and size as the switching transistor and connected in series to the dummy variable resistance section; a dummy current source that applies a current to the series-connected dummy variable resistance section and dummy transistor; and a comparator configured to compare an output voltage at the time of applying the current to the series-connected dummy variable resistance section and dummy transistor to a reference voltage.

It is also preferable that the dummy circuit section include: a dummy variable resistance section having the same configuration as, but a different size from, the variable resistance section; a dummy transistor having the same configuration as, but a different size from, the switching transistor and connected in series to the dummy variable resistance section; a dummy current source that applies a current to the series-connected dummy variable resistance section and dummy transistor; and a comparator configured to compare an output voltage at the time of applying the current to the series-connected dummy variable resistance section and dummy transistor to a reference voltage.

It is also preferable that the dummy circuit section include: a dummy variable resistance section having the same configuration and size as the variable resistance section; a dummy transistor having the same configuration and size as the switching transistor and connected in series to the dummy variable resistance section; a dummy current source that applies a current to the series-connected dummy variable resistance section and dummy transistor; and an operational amplifier adapted to adjust a resistance of the dummy variable resistance section.

It is also preferable that the dummy circuit section include: a dummy variable resistance section having the same configuration as, but a different size from, the variable resistance section; a dummy transistor having the same configuration as, but a different size from, the switching transistor and connected in series to the dummy variable resistance section; a dummy current source that applies a current to the series-connected dummy variable resistance section and dummy transistor; and an operational amplifier adapted to adjust a resistance of the dummy variable resistance section.

It is also preferable that the constant current driver supply a constant current to an output terminal connected to the transmission line from a supply voltage.

It is also preferable that the constant current driver draw a constant current to ground from an output terminal connected to the transmission line.

It is also preferable that the constant current driver supply a constant current to an output terminal connected to the transmission line from a supply voltage, or draw a constant current from the output terminal to ground.

It is also preferable that the constant current driver be switched between an ON state for generating the constant current and an OFF state for not generating the constant current.

It is also preferable that the constant current driver be switched between the ON state and the OFF state at the moment when the switching transistor switches the output between the H level and the L level.

It is also preferable that data transmission be performed in accordance with an on/off control of the switching transistor, and an Emphasis and de-Emphasis function be performed in accordance with the constant current of the constant current driver.

It is also preferable that the constant current driver change a value of the constant current to be generated.

According to another aspect of the present invention, there is provided a differential output device that performs signal transmission with a positive output and a negative output comprising the above-described output device for each of the positive output and the negative output.

According to another aspect of the present invention, there is provided a semiconductor laser modulation drive device comprising: a semiconductor laser drive unit and a semiconductor laser modulation unit each including a chip; wherein the semiconductor laser modulation unit includes the above-described output device or the above-described differential output device to transmit electrical signals between the semiconductor laser modulation unit and the semiconductor laser drive unit.

According to another aspect of the present invention, there is provided an image forming apparatus, comprising: a semiconductor laser adapted to perform optical writing to form an electrostatic latent image on a photoreceptor; and the semiconductor laser modulation drive device to drive the semiconductor laser.

According to another aspect of the present invention, there is provided an electronic device comprising: integrated circuits or printed circuit boards to control elements of the electronic device; and the above-described output device or the above-described differential output device to transmit electrical signals between the integrated circuits or between the printed circuit boards.

By having the impedance matching section that includes the impedance adjustment section, and the dummy circuit section having the same configuration as the impedance adjustment section and adapted to calculate the adjustment value for matching the output impedance to the characteristic impedance of the transmission line, and is configured to set the adjustment value calculated by the dummy circuit section to the impedance adjustment section to match the output impedance to the characteristic impedance, it is possible to properly adjust the output impedance of an output section to match the output impedance to match the output impedance to the characteristic impedancethe characteristic impedance without connecting a monitoring comparator to an output terminal. Also, by having the switching transistor connected in series to the impedance matching section and configured to be turned on/off so as to switch the output between the H level and the L level, and the constant current driver configured to add the constant current to the output, it is possible to increase the output speed. Therefore, the output device is applicable to high-speed transmission.

With the above-described preferable configurations, the output device can be more simplified. By setting the combined resistance of the dummy circuit relatively high, the constant current from the dummy current source can be reduced. Accordingly, the consumption current can be reduced.

The output device can be made more suitable for high-speed transmission by having the constant current driver configured to supply a constant current to the output terminal connected to the transmission line from the supply voltage, or to draw the constant current from the output terminal to ground. By performing the switching of the constant current together with switching of data between the H level and the L level, the speed of supplying and drawing electric charges to and from the output terminal can be increased. Thus, the speed of the data switching can be increased.

The output device can be made more suitable for high-speed transmission by having the Emphasis function that sets the output voltage relatively high in advance by redundantly supplying the constant current from the constant current driver at the time of switching the data, and the de-Emphasis function for reducing the output voltage of the data of the second bit and the following bits by drawing the constant current into the constant current driver if the same data are continuously output in view of attenuation of the output voltage due to inductor components of the output terminal.

By having the constant current driver capable of changing the value of the constant current to be generated, it is possible to adjust the swing amount of the output voltage, and the Emphasis and de-Emphasis amounts.

It is possible to correct an output impedance of the output section with a simple configuration in the case of differential signal transmission as well, so the high-speed transmission is achieved.

The semiconductor laser modulation drive device can achieve the effects described above by having the output device or the differential output device.

The image forming apparatus can achieve the effects described above by having the semiconductor laser modulation drive device.

The electronic device can achieve the effects described above by having the output device or the differential output device that transmits electrical signals between the integrated circuits or between the printed circuit boards.

According to another aspect of the present invention, there is provided an impedance matching device adapted to control an output impedance or an input impedance in a transmitter section or a receiver section of an integrated circuit used for high-speed electrical signal transmission, the impedance matching device comprising a resistor, an impedance matching transistor, and an operational amplifier.

According to another aspect of the present invention, there is provided an impedance matching device adapted to control an output impedance or an input impedance in a transmitter section or a receiver section of an integrated circuit used for high-speed electrical signal transmission, the impedance matching device comprising a terminator including a resistor and an impedance matching transistor, and a reference voltage generator including an operational amplifier, wherein the operational amplifier controls a gate voltage of the impedance matching transistor to have a desired impedance.

It is preferable that the reference voltage generator include a dummy circuit section having the same circuit configuration as the terminator.

It is also preferable that the value of a resistance in the dummy circuit section be different from the value of a resistance in the terminator, and the size of an impedance matching transistor in the dummy circuit section be different from the size of the impedance matching transistor in the terminator.

It is also preferable that the reference voltage generator include an integrator that integrates a voltage of an output terminal of the transmitter section or a voltage of an input terminal of the receiver section.

It is also preferable that if a differential transmission is employed as a transmission system, the reference voltage generator include an average generator that outputs an average value of a differential output and a differential input.

According to another aspect of the present invention, there is provided a semiconductor laser modulation drive device comprising a semiconductor laser drive unit, and a semiconductor laser modulation unit, wherein if the semiconductor laser drive unit and the semiconductor laser modulation unit each includes a chip, the above-described impedance matching device is used for signal transmission between the semiconductor laser drive unit and the semiconductor laser modulation unit.

According to another aspect of the present invention, there is provided an image forming apparatus comprising the above-described impedance matching device for signal transmission between chips or between boards in the image forming apparatus.

According to the present invention, it is possible to provide the impedance matching device with a simple configuration capable of controlling an output impedance or an input impedance of a transmitter section or a receiver section of an integrated circuit used for high-speed signal transmission, a semiconductor laser modulation drive device and the image forming apparatus using the impedance matching device.

DETAILED DESCRIPTION OF THE PREFERRED EMBODIMENT

Preferred embodiments of the present invention are described hereinafter with reference to the accompanying drawings.

First Embodiment

Figure 1:
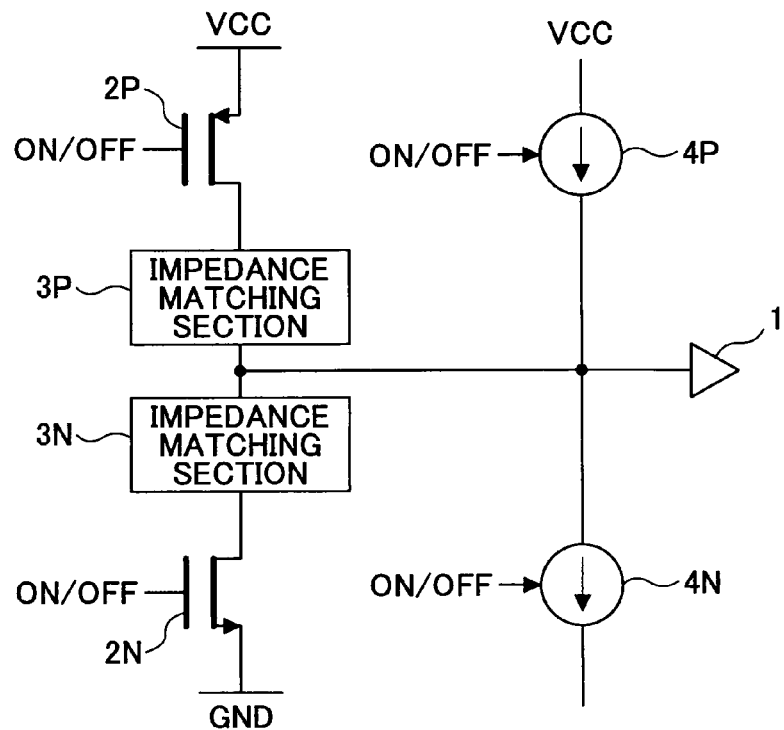
FIG. 1 is a circuit diagram illustrating a basic configuration example of an output section of an output device applied to high-speed electrical signal transmission according to a first embodiment of the present invention.

FIG. 1 is a circuit diagram illustrating a basic configuration example of an output section of an output device applied to high-speed electrical signal transmission according to a first embodiment. The output section of the output device of this embodiment corresponds to, for example, an output section in an integrated circuit (IC chip). An output terminal 1 of the output section is connected to a transmission line (not shown). Roughly, the output section comprises a P-FET switching transistor 2P and a N-FET switching transistor 2N configured to turn on/off according to a predetermined signal so as to switch a data output between "1" (H level) and "0" (L level), a P-type impedance matching section 3P and an N-type impedance matching section 3N configured to adjust and match an output impedance of the output section to a characteristic impedance of the transmission line, and variable current sources (constant current drive sections) 4P and 4N that redundantly output a constant current to the output terminal 1. The current sources 4P and 4N are also configured to turn on/off according to a predetermined signal. Specifically, the current sources 4P and 4N are configured to be switched between an ON state to generate a constant current and an OFF state to not generate a constant current.

These components are connected in the following manner. The switching transistor 2P, the impedance matching section 3P, the impedance matching section 3N, and the switching transistor 2N are connected in series between a supply voltage VCC and ground GND. A point between the impedance matching sections 3P and 3N is connected to the output terminal 1. The current sources 4P and 4N are connected in series between a supply voltage VCC and ground GND. A point between the current sources 4P and 4N is connected to the output terminal 1. In other words, the current source 4P is arranged in parallel with a series circuit comprising the switching transistor 2P and the impedance matching section 3P, while the current source 4N is arranged in parallel with a series circuit comprising the impedance matching section 3N and the switching transistor 2N.

With this configuration, data of "0" or "1" are output from the output terminal 1 by turning on/off the switching transistors 2P and 2N. Only one of the switching transistors 2P and 2n is turned on upon outputting the data. The impedance matching sections 3P and 3N can set the output impedance of the output device to a desired value as described below. The current source 4P, which is capable of changing the amount of the current, applies the constant current from the supply voltage VCC to the output terminal 1. The current source 4N, which is also capable of changing the amount of the current, draws the constant current from the output terminal 1 to the ground GND. The current sources 4P and 4N can perform constant current switching according to on/off signals. By performing the switching of the current together with the switching of the data from "1" (H level) to "0" (L level) or from "0" (L level) to "1" (H level), the speed of supplying and drawing electric charges to and from the output terminal 1 can be increased. Thus, the speed of the data switching can be increased. In view of attenuation of an output voltage due to inductor components of the output terminal 1, there may be provided a function (Emphasis function) that sets the output voltage relatively high in advance by redundantly supplying the constant current from the current source 4P at the time of switching the data. There may also be provided a function (de-Emphasis function) for reducing the output voltage of the data of the second bit and the following bits by drawing the constant current with the current source 4N if the same data are continuously output. As the value of the current from the current sources 4P and 4N is variable, it is possible to adjust the swing amount of the output voltage, and the Emphasis and de-Emphasis amounts.

Figure 2:
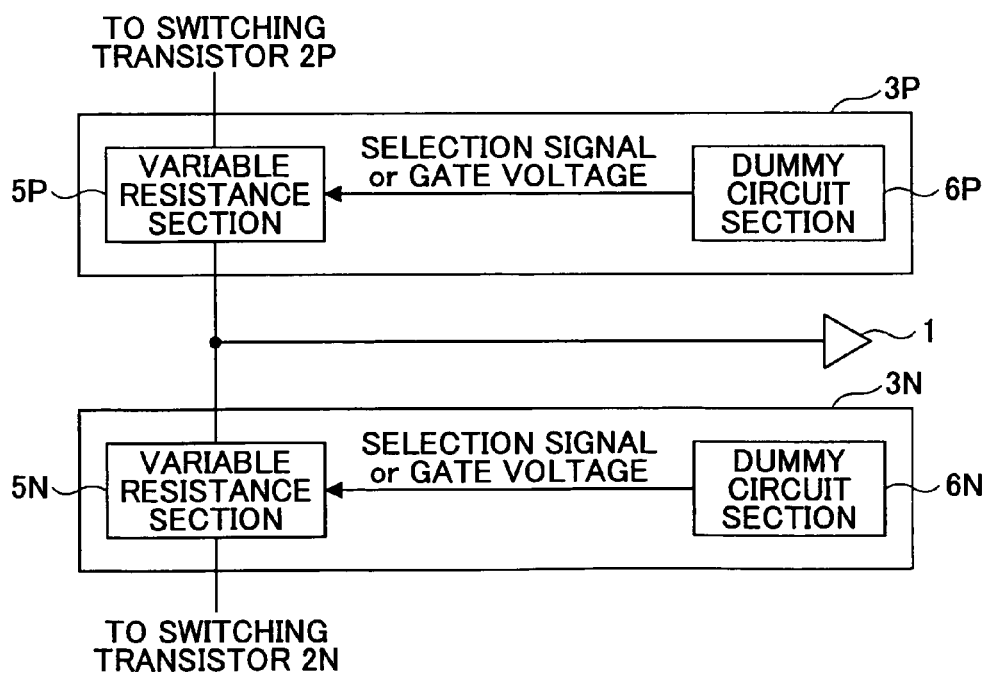
FIG. 2 is a block diagram illustrating a configuration example of impedance matching sections.

FIG. 2 is a block diagram illustrating a schematic configuration example of the impedance matching sections 3P and 3N. The impedance matching sections 3P and 3N comprise variable resistance sections 5P and 5N and dummy circuit sections 6P and 6N, respectively. The dummy circuit sections 6P and 6N generate selection signals or transistor's gate voltages that serve as adjustment values to make series impedances (output impedances) of the variable resistance sections 5P and 5N and the corresponding switching transistors 2P and 2N, and set the adjustment values to the variable resistance sections 5P and 5N so as to correct corresponding resistances (combined impedances) of the variable resistance sections 5P and 5N.

Figure 3:
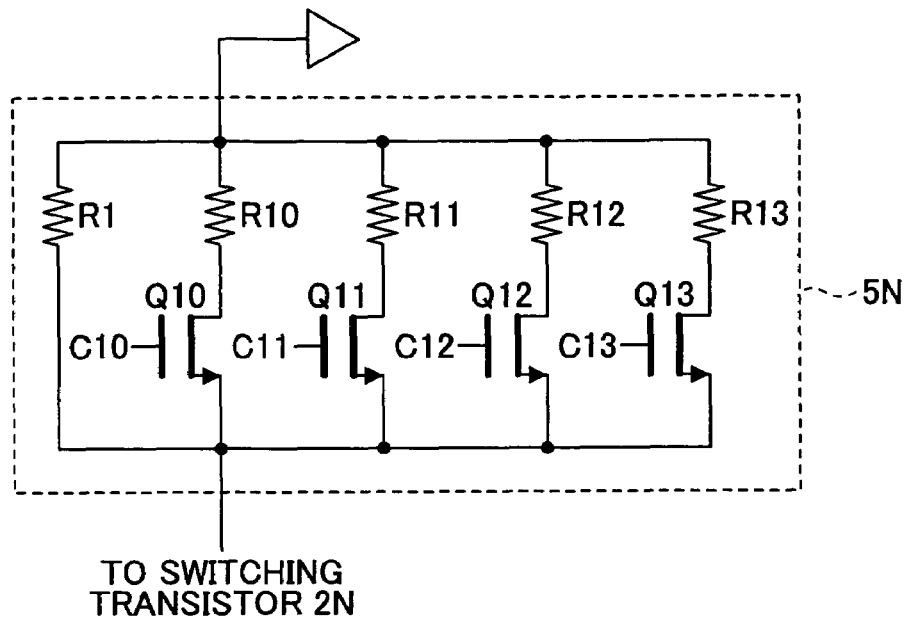
FIG. 3 is a circuit diagram illustrating a configuration example of one variable resistance section.

FIG. 3 is a circuit diagram illustrating a configuration example of the variable resistance section 5N. The variable resistance section 5N of this embodiment comprises a parallel circuit including plural resistors R1, R10, R11, R12, and R13, and N-FET transistors Q10, Q11, Q12, and Q13 connected in series to the corresponding resistors R10, R11, R12, and R13. The transistors Q10, Q11, Q12, and Q13 are configured to turn on/off according to selection signals c10, c11, c12, and c13, respectively. The resistor R1, to which no transistor is connected, serves as a reference resistor. Accordingly, in the variable resistance section 5N, by turning on/off the transistors Q10, Q11, Q12, and Q13 so as to connect one or more of the resistors R10, R11, R12 and R13 in parallel to the resistor R1, a combined resistance (combined impedance) is adjusted to a desired value. Thus, a variation of the resistance (impedance) of the reference resistor R1 can be corrected.

Figure 4:
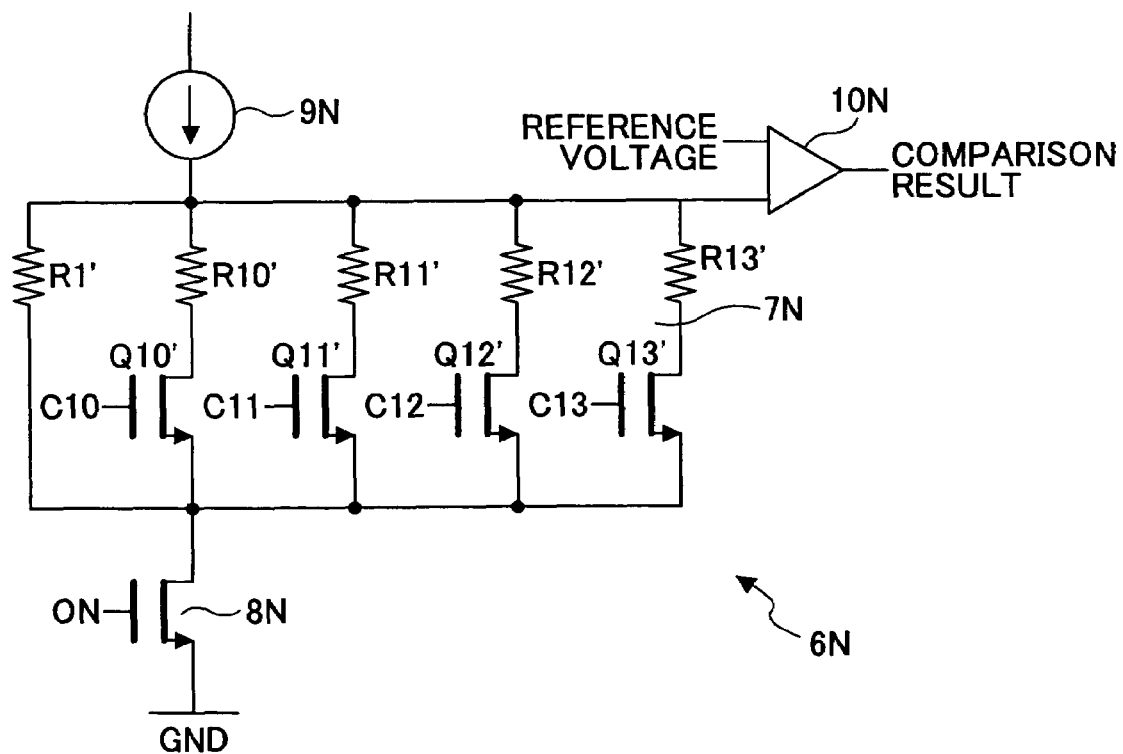
FIG. 4 is a circuit diagram illustrating a configuration example of a dummy circuit section corresponding to the variable resistance section of FIG. 3.

FIG. 4 is a circuit diagram illustrating a configuration example of the dummy circuit section 6N corresponding to the variable resistance section 5N. The dummy circuit section 6N comprises a dummy variable resistance section 7N having the same configuration and size as the variable resistance section 5N and including resistors and transistors denoted by the same reference numbers (but with a mark '), a dummy transistor 8N having the same configuration and size as the switching transistor 2N and connected in series to the dummy variable resistance section 7N, a dummy current source 9N for supplying a predetermined constant current to a series circuit including the dummy variable resistance section 7N and the dummy transistor 8N, and a comparator 10N for comparing a voltage output when the predetermined constant current is applied to the series circuit including the dummy variable resistance section 7N and the dummy transistor 8N to a predetermined reference voltage.

While the dummy circuit section 6N is in operation, the dummy transistor 8N is in an ON state. When a preset constant current is applied from the dummy current source 9N to the dummy variable resistance section 7N, the comparator 10N compares a voltage output from the dummy variable resistance section 7N to the reference voltage, and outputs the comparison result. Selection signals c10, c11, c12, and c13 for transistors Q10', Q11', Q12', and Q13' are signals that indicate either one of two values, an H level or an L level. The selection signals c10, c11, c12, and c13 are sequentially incremented so as to gradually increase or reduce the combined resistance of the resistors R1', R11', R12', and R13'. If a change is found in the comparison result, the selection signals at that point are registered in a register or the like. The combined resistance is determined by the value of the current and the reference voltage. For example, when the value of the current from the dummy current source 9N is 5 mA and the reference voltage is 250 mV, the combined resistance is 50 Ω. By setting desired selection signals obtained in this way as the selection signals c10, c11, c12 and c13 in the variable resistance section 5N shown in FIG. 3, the output impedance of the output section at the time when the switching transistor 2N is turned on can be set to a desired impedance.

In the dummy circuit section 6N shown in FIG. 4, it is possible to reduce the value of the current from the dummy current source 9N, by making the resistance (size) of the resistors R1'-R13' in the dummy variable resistance section 7N and the size of the dummy transistor 8N different from the resistance (size) of the resistors R1-R13 in the variable resistance section 5N and the size of the switching transistor 2N, respectively, such that the combined resistance of the dummy circuit section 6N becomes greater than the combined resistance of the variable resistance section 5N. In this case, the ratio between the resistance of the resistors R1'-R13' and the ON state source-drain resistance of the dummy transistor 8N in the dummy circuit section 6N is set to be equal to the ratio between the resistance of the resistors R1-R13 in the variable resistance section 5N and the ON state source-drain resistance of the switching transistor 2N.

Figure 5:
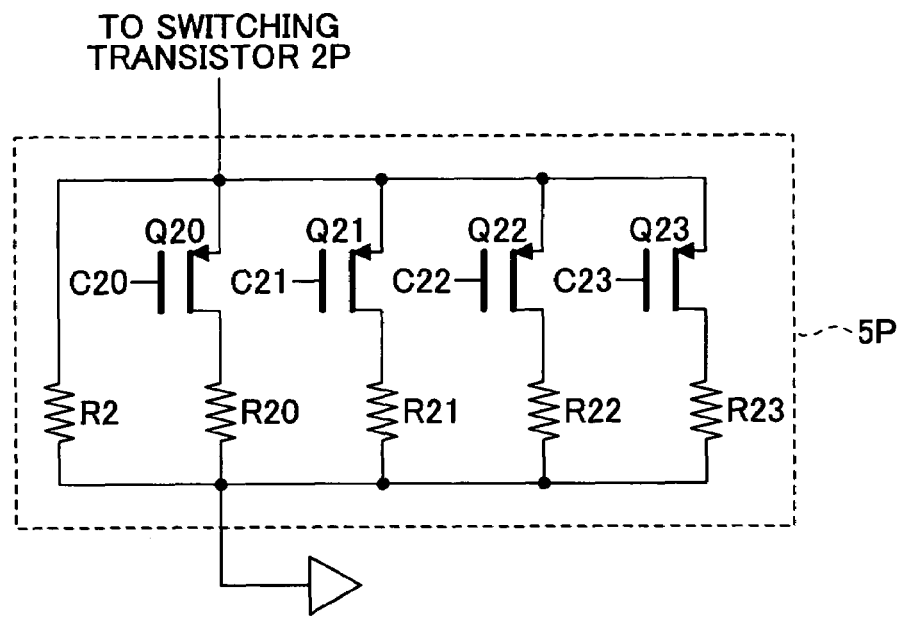
FIG. 5 is a circuit diagram illustrating a configuration example of another variable resistance section.

FIG. 5 is a circuit diagram illustrating a configuration example of the variable resistance section 5P. The variable resistance section 5P of this embodiment, as with the variable resistance section 5N, comprises a parallel circuit including plural resistors R2, R20, R21, R22, and R23, and P-FET transistors Q20, Q21, Q22, and Q23 connected in series to the corresponding resistors R20, R21, R22, and R23. The transistors Q20, Q21, Q22, and Q23 are configured to turn on/off according to selection signals c20, c21, c22, and c23, respectively. The resistor R2, to which no transistor is connected, serves as a reference resistor. Accordingly, in the variable resistance section 5P, by turning on/off the transistors Q20, Q21, Q22, and Q23 so as to connect one or more of the resistors R20, R21, R22 and R23 in parallel to the resistor R2, a combined resistance (combined impedance) is adjusted to a desired value. Thus, a variation of the resistance (impedance) of the reference resistor R2 can be corrected.

Figure 6:
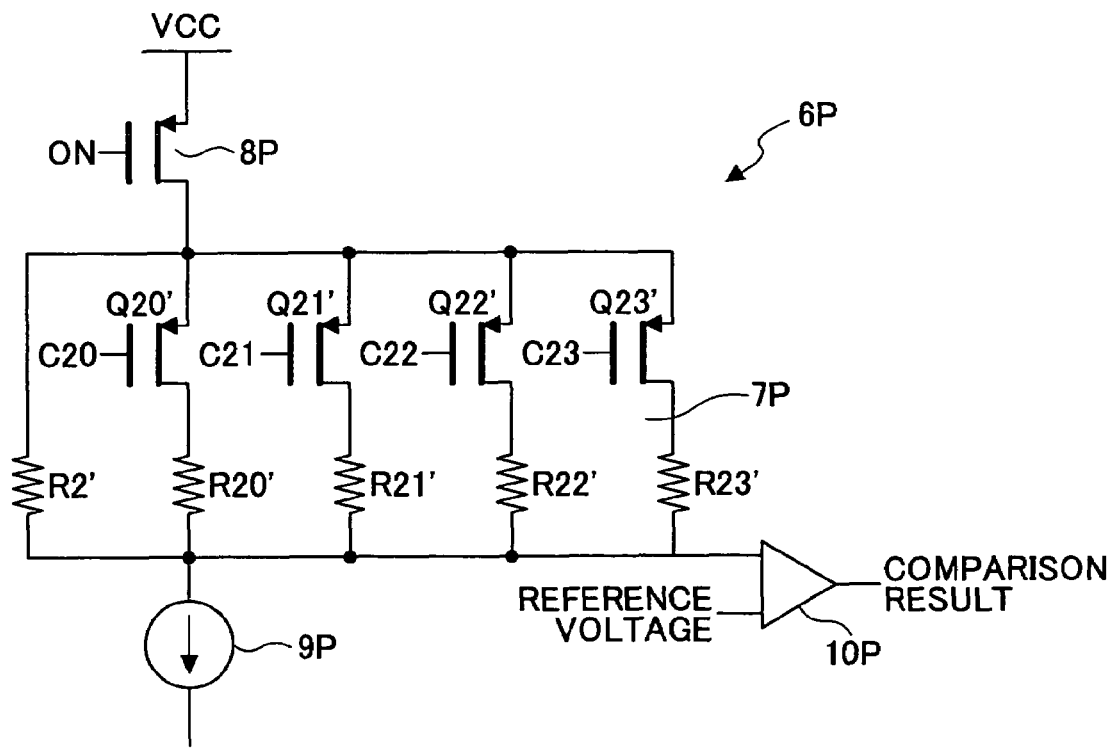
FIG. 6 is a circuit diagram illustrating a configuration example of a dummy circuit section corresponding to the variable resistance section of FIG. 5.

FIG. 6 is a circuit diagram illustrating a configuration example of the dummy circuit section 6P corresponding to the variable resistance section 5P. The dummy circuit section 6P comprises a dummy variable resistance section 7P having the same configuration and size as the variable resistance section 5P and including resistors and transistors denoted by the same reference numbers (but with a mark '), a dummy transistor 8P having the same configuration and size as the switching transistor 2P and connected in series to the dummy variable resistance section 7P, a dummy current source 9P for supplying a predetermined constant current to a series circuit including the dummy variable resistance section 7P and the dummy transistor 8P, and a comparator 10P for comparing a voltage output when the predetermined constant current is applied to the series circuit including the dummy variable resistance section 7P and the dummy transistor 8P to a predetermined reference voltage.

While the dummy circuit section 6P is in operation, the dummy transistor 8P is in an ON state. When a preset constant current is applied from the dummy current source 9P to the dummy variable resistance section 7P, the comparator 10P compares a voltage output from the dummy variable resistance section 7P to the reference voltage, and outputs the comparison result. Selection signals c20, c21, c22, and c23 for transistors Q20', Q21', Q22', and Q23' are signals that indicate either one of two values, an H level or an L level. The selection signals c20, c21, c22, and c23 are sequentially incremented so as to gradually increase or reduce the combined resistance of the resistors R2', R21', R22', and R23'. If a change is found in the comparison result, the selection signals at that point are registered in a register or the like. As in the dummy circuit section 6N shown in FIG. 4, the combined resistance is determined by the value of the current and the reference voltage. By setting desired selection signals obtained in this way as the selection signals c20, c21, c22 and c23 in the variable resistance section 5P shown in FIG. 5, the output impedance of the output section at the time when the switching transistor 2P is turned on can be set to a desired impedance.

In the dummy circuit section 6P shown in FIG. 6, it is possible to reduce the value of the current from the dummy current source 9P, by making the resistance (size) of the resistors R2'-R23' in the dummy variable resistance section 7P and the size of the dummy transistor 8P different from the resistance (size) of the resistors R2-R23 in the variable resistance section 5P and the size of the switching transistor 2P, respectively, such that the combined resistance of the dummy circuit section 6P becomes greater than the combined resistance of the variable resistance section 5P. In this case, the ratio between the resistance of the resistors R2'-R23' and the ON state source-drain resistance of the dummy transistor 8P in the dummy circuit section 6P is set to be equal to the ratio between the resistance of the resistors R1-R13 in the variable resistance section 5P and the ON state source-drain resistance of the switching transistor 2P.

Figure 7:
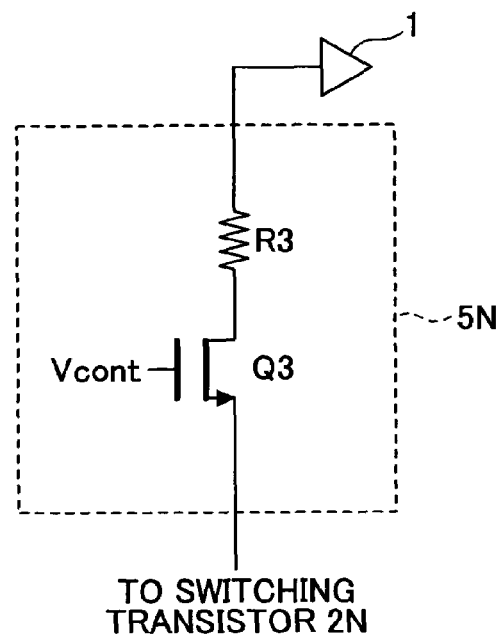
FIG. 7 is a circuit diagram illustrating another configuration example of the variable resistance section of FIG. 3.

FIG. 7 is a circuit diagram illustrating another configuration example of the variable resistance section 5N. In this configuration example, the variable resistance section 5N comprises a series circuit including a resistor R3 and an N-FET transistor Q3. The transistor Q3 is provided as a resistor for correcting a variation of the resistance of the resistor R3. The resistance of the transistor Q3 is adjusted by changing a gate voltage Vcont thereof. Thus, a combined resistance (combined impedance) of the resistor R3 and the transistor Q3 is adjusted to a desired impedance.

Figure 8:
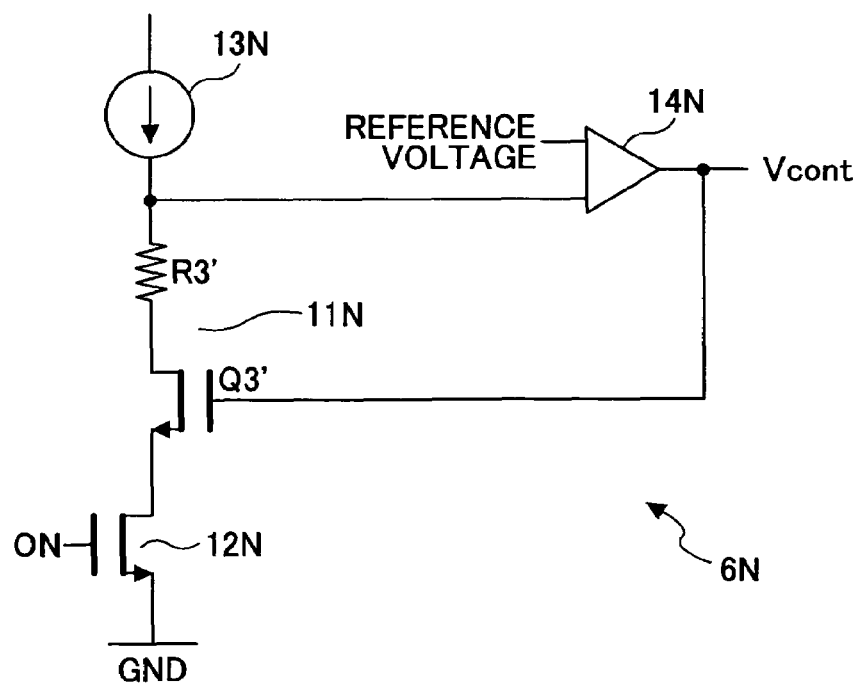
FIG. 8 is a circuit diagram illustrating a configuration example of a dummy circuit section corresponding to the variable resistance section of FIG. 7.

FIG. 8 is a circuit diagram illustrating a configuration example of a dummy circuit section 6N corresponding to the variable resistance section 5N of FIG. 7. The dummy circuit section 6N comprises a dummy variable resistance section 11N having the same configuration and size as the variable resistance section 5N of FIG. 7 and including a resistor R3' and a transistor Q3', a dummy transistor 12N having the same configuration and size as the switching transistor 2N and connected in series to the dummy variable resistance section 11N, a dummy current source 13N for supplying a predetermined constant current to a series circuit including the dummy variable resistance section 11N and the dummy transistor 12N, and an operational amplifier 14N for adjusting and controlling a gate voltage Vcont to the transistor Q3' based on a voltage output when the predetermined constant current is applied to the series circuit including the dummy variable resistance section 11N and the dummy transistor 12N.

While the dummy circuit section 6N is in operation, the dummy transistor 12N is in an ON state. A preset constant current is applied from the dummy current source 13N to the dummy variable resistance section 11N. An output voltage is input into the operational amplifier 14N and negatively fed back so as to be virtually short circuited with a reference voltage. The gate voltage Vcont is controlled in this way, thereby adjusting the resistance of the transistor Q3'. A combined resistance at the time of the virtual short-circuiting is determined by the value of the current from the dummy current source 13N and the reference voltage. By inputting the gate voltage Vcont applied herein as the gate voltage Vcont in the variable resistance section 5N of FIG. 7 into the transistor Q3, the output impedance of the output section at the time when the switching transistor 2N is turned on can be set to a desired value (characteristic impedance of the transmission line).

In the dummy circuit section 6N shown in FIG. 8, it is possible to reduce the value of the current from the dummy current source 13N, by making the resistance (size) of the resistors R3' in the dummy variable resistance section 11N and the size of the dummy transistor 12N different from the resistance (size) of the resistors R3 in the variable resistance section 5N and the size of the switching transistor 2N, respectively, such that the combined resistance of the dummy circuit section 6N becomes greater than the combined resistance of the variable resistance section 5N. In this case, the ratio between the resistance of the resistors R3' and the ON state source-drain resistance of the dummy transistor 12N in the dummy circuit section 6N is set to be equal to the ratio between the resistance of the resistor R3 in the variable resistance section 5N and the ON state source-drain resistance of the switching transistor 2N.

Figure 9:
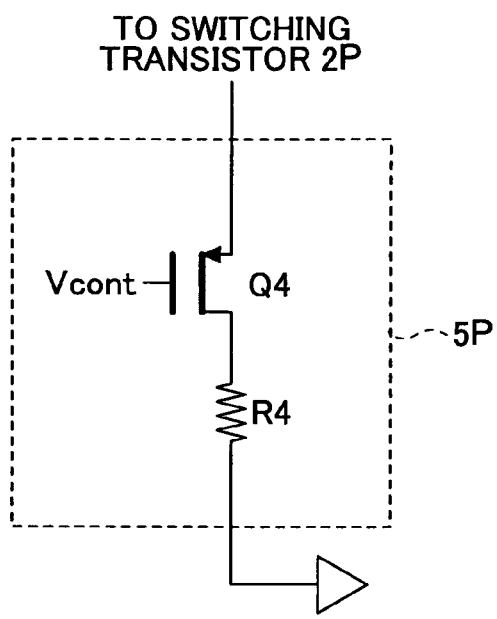
FIG. 9 is a circuit diagram illustrating another configuration example of the variable resistance section of FIG. 5.

FIG. 9 is a circuit diagram illustrating another configuration example of the variable resistance section 5P. In this configuration example, just like the variable resistance section 5N of FIG. 7, the variable resistance section 5P comprises a series circuit including a P-FET transistor Q4 and a resistor R4. The transistor Q4 is provided as a resistor for correcting a variation of the resistance of the resistor R4. The resistance of the transistor Q4 is adjusted by changing a gate voltage Vcont thereof. Thus, a combined resistance (combined impedance) of the resistor R4 and the transistor Q4 is adjusted to a desired impedance.

Figure 10:
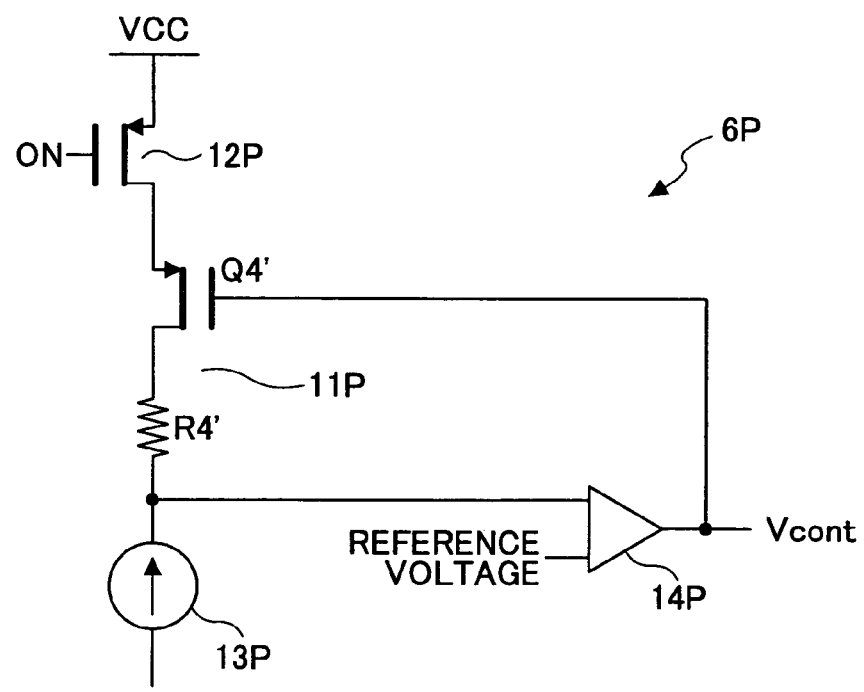
FIG. 10 is a circuit diagram illustrating a configuration example of a dummy circuit section corresponding to the variable resistance section of FIG. 9.

FIG. 10 is a circuit diagram illustrating a configuration example of a dummy circuit section 6P corresponding to the variable resistance section 5P of FIG. 9. The dummy circuit section 6P comprises a dummy variable resistance section 11P having the same configuration and size as the variable resistance section 5P of FIG. 9 and including a resistor R4' and a transistor Q4', a dummy transistor 12P having the same configuration and size as the switching transistor 2P and connected in series to the dummy variable resistance section 11P, a dummy current source 13P for supplying a predetermined constant current to a series circuit including the dummy variable resistance section 11P and the dummy transistor 12P, and an operational amplifier 14P for adjusting and controlling a gate voltage Vcont to a transistor Q4' based on a voltage output when the predetermined constant current is applied to the series circuit including the dummy variable resistance section 11P and the dummy transistor 12P.

While the dummy circuit section 6P is in operation, the dummy transistor 12P is in an ON state. A preset constant current is applied from the dummy current source 13P to the dummy variable resistance section 11P. An output voltage is input into the operational amplifier 14P and negatively fed back so as to be virtually short circuited with a reference voltage. The gate voltage Vcont is controlled in this way, thereby adjusting the resistance of the transistor Q4'. A combined resistance at the time of the virtual short-circuiting is determined by the value of the current from the dummy current source 13P and the reference voltage. By inputting the gate voltage Vcont applied herein as the gate voltage Vcont in the variable resistance section 5P of FIG. 9 into the transistor Q4, the output impedance of the output section at the time when the switching transistor 2P is turned on can be set to a desired value (characteristic impedance of the transmission line).

In the dummy circuit section 6P shown in FIG. 10, it is possible to reduce the value of the current of the dummy current source 13P, by making the resistance (size) of the resistor R4' in the dummy variable resistance section 11P and the size of the dummy transistor 12P different from the resistance (size) of the resistor R4 in the variable resistance section 5P and the size of the switching transistor 2P, respectively, such that the combined resistance of the dummy circuit section 6P becomes greater than the combined resistance of the variable resistance section 5P. In this case, the ratio between the resistance of the resistors R4' and the ON state source-drain resistance of the dummy transistor 12P in the dummy circuit section 6P is set to be equal to the ratio between the resistance of the resistor R4 in the variable resistance section 5P and the ON state source-drain resistance of the switching transistor 2P.

Figure 11:
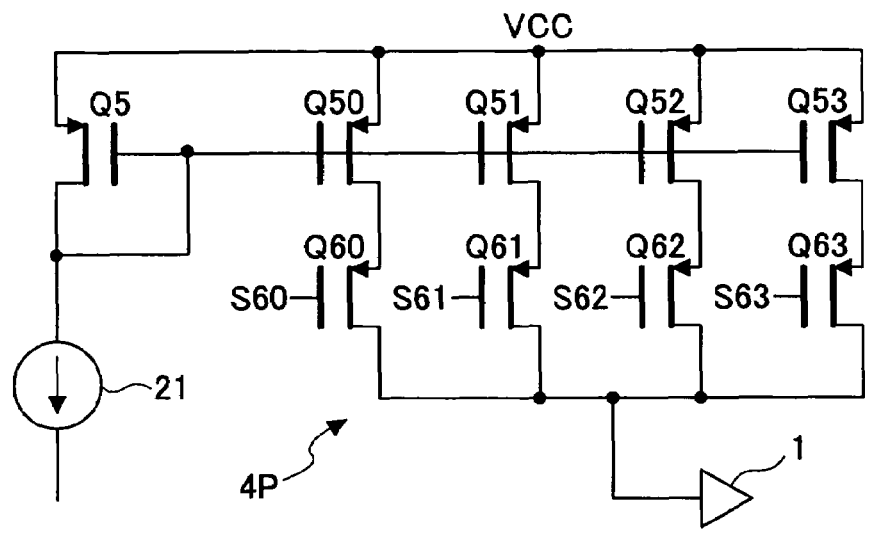
FIG. 11 is a circuit diagram illustrating a configuration example of one variable current source.

FIG. 11 is a circuit diagram illustrating a configuration example of the variable current source (constant current drive section) 4P. The variable current source 4P of this embodiment comprises a constant current source 21, a P-FET transistor Q5 connected in series to the constant current source 21, plural transistors Q50, Q51, Q52, and Q53 a gate of each of which is connected to the transistor Q5 so as to form a current mirror circuit together with the transistor Q5, and switching transistors Q60, Q61, Q62, and Q63 connected in series to the corresponding transistors Q50, Q51, Q52, and Q53. The switching transistors Q60, Q61, Q62, and Q63 are configured to selectively turn on/off according to selection signals s60, s61, s62, and s63, respectively.

With this configuration, the output of the current source 4P is turned on/off by turning on/off the switching transistors Q60, Q61, Q62, and Q63 according to the selection signals s60, s61, s62, and S63. At the same time, the value of the constant current output from the current source 4P is changed by changing the transistors Q50, Q51, Q52, and Q53 to be turned on or by turning on two or more of them.

Figure 12:
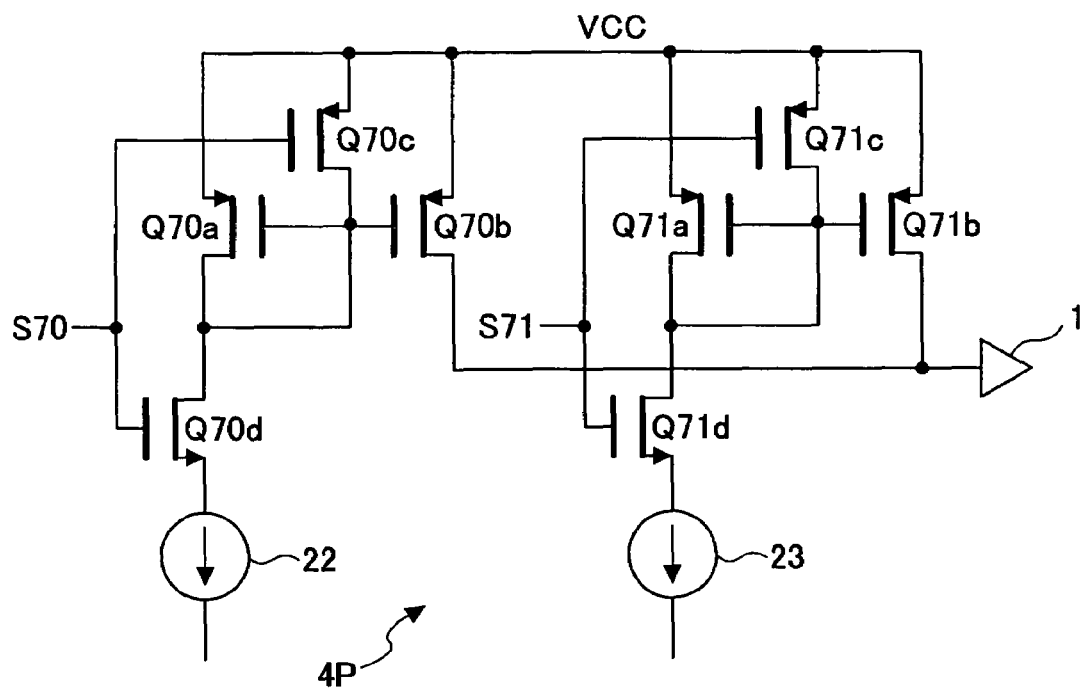
FIG. 12 is a circuit diagram illustrating another configuration example of the variable current source of FIG. 11.

FIG. 12 is a circuit diagram illustrating another configuration example of the variable current source (constant current drive section) 4P. In this example, the variable current source 4P comprises P-FET transistors Q70a, Q70b, Q71a, and Q71b so as to form plural current mirror circuits of which outputs have an OR-connection, constant current sources 22 and 23 for the corresponding current mirror circuits, and P-FET switching transistors Q70c, Q70d, Q71c, and Q71d for turning on/off the current mirror circuits according to selection signals s70 and s71.

With this configuration, the output of the current source 4P is turned on/off by turning on/off the switching transistors Q70c, Q70d, Q71c, and Q71d according to the selection signals s70 and s71. At the same time, the value of the constant current output from the current source 4P is changed by changing the current mirror circuit to be activated or by activating both of the current mirror circuits.

Figure 13:
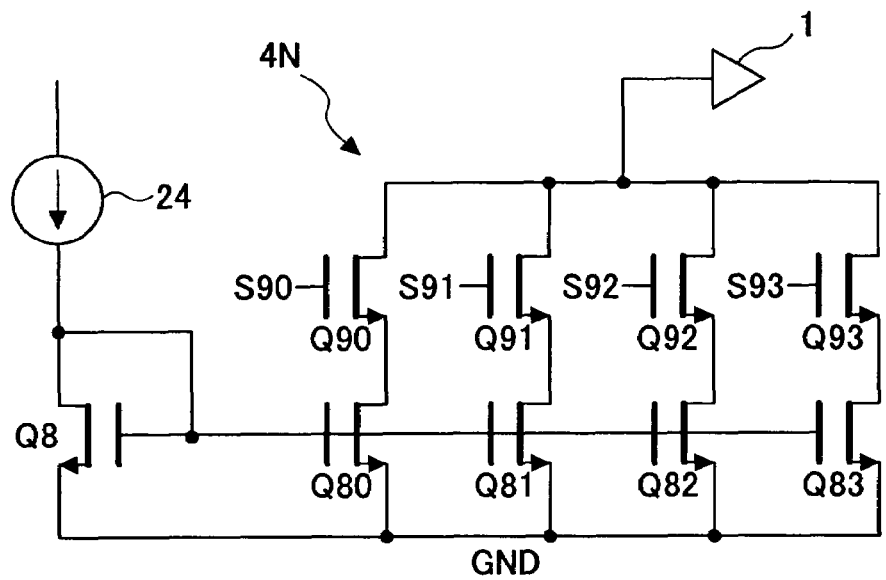
FIG. 13 is a circuit diagram illustrating a configuration example of the other variable current source.

FIG. 13 is a circuit diagram illustrating a configuration example of the variable current source (constant current drive section) 4N. The variable current source 4N of this embodiment comprises a constant current source 24, an N-FET transistor Q8 connected in series to the constant current source 24, plural transistors Q80, Q81, Q82, and Q83 a gate of each of which is connected to the transistor Q8 so as to form a current mirror circuit together with the transistor Q8, and switching transistors Q90, Q91, Q92, and Q93 connected in series to the corresponding transistors Q80, Q81, Q82, and Q83. The switching transistors Q90, Q91, Q92, and Q93 are configured to selectively turn on/off according to selection signals s90, s91, s92, and s93, respectively.

With this configuration, the output of the current source 4N is turned on/off by turning on/off the switching transistors Q90, Q91, Q92, and Q93 according to the selection signals s90, s91, s92, and S93. At the same time, the value of the constant current output from the current source 4N is changed by changing the transistors Q90, Q91, Q92, and Q93 to be turned on or by turning on two or more of them.

Figure 14:
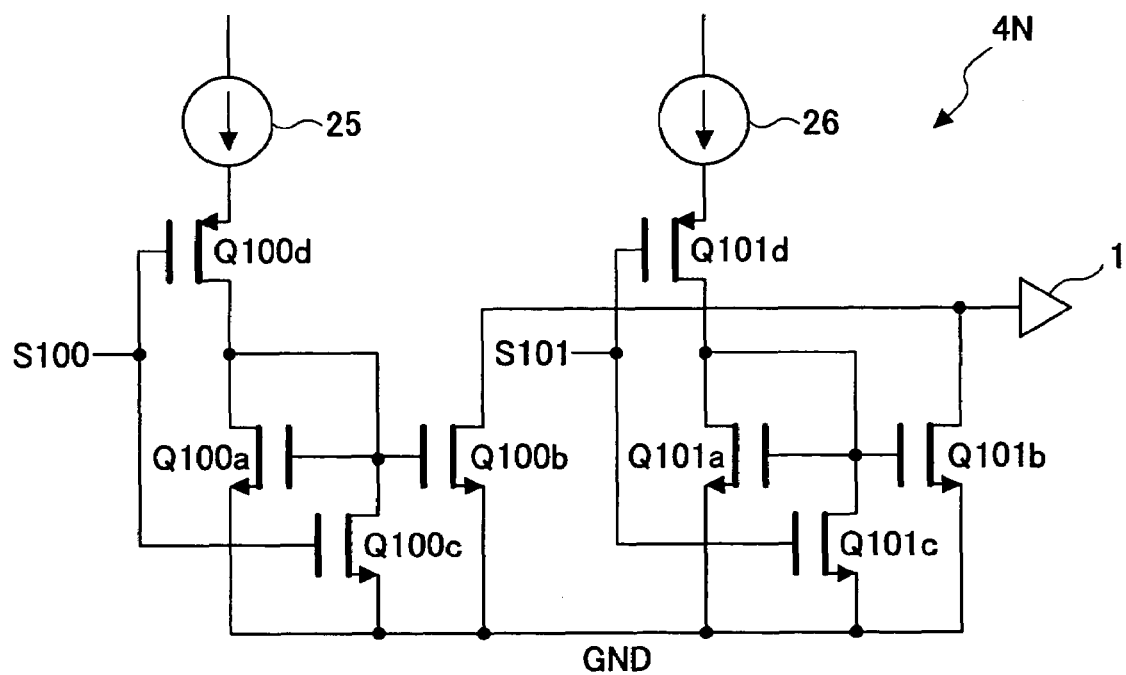
FIG. 14 is a circuit diagram illustrating another configuration example of the variable current source of FIG. 13.

FIG. 14 is a circuit diagram illustrating another configuration example of the variable current source (constant current drive section) 4N. In this example, the variable current source 4N comprises N-FET transistors Q100a, Q100b, Q101a, and Q101b so as to form plural current mirror circuits of which outputs have an OR-connection, constant current sources 25 and 26 for the corresponding current mirror circuits, and N-FET switching transistors Q100c, Q100d, Q101c, and Q101d for turning on/off the current mirror circuits according to selection signals s100 and s101.

With this configuration, the output of the current source 4N is turned on/off by turning on/off the transistors Q100c, Q100d, Q101c, and Q101d according to the selection signals s100 and s101. At the same time, the value of the constant current output from the current source 4N is changed by changing the current mirror circuit to be activated or by activating both of the current mirror circuits.

By performing the switching of the current sources 4P and 4N with the above exemplified configurations at the same moment that the data are switched from the H level to the L level or from the L level to the H level, the speed of supplying and drawing electric charges to and from the output terminal 1 can be increased. Thus, the speed of data switching can be increased. In view of attenuation of the output voltage due to inductor components of the output terminal 1, there may be provided a function (Emphasis function) for setting the output voltage relatively high in advance by redundantly supplying the constant current from the current source 4P at the time of switching the data. There may also be provided a function (de-Emphasis function) for reducing the output voltage of the data of the second bit and the following bits by drawing the constant current into the current source 4N if the same data are continuously output. As the value of the current from the current sources 4P and 4N is variable, it is possible to adjust the swing amount of the output voltage, and the Emphasis and de-Emphasis amounts.

Figure 15:
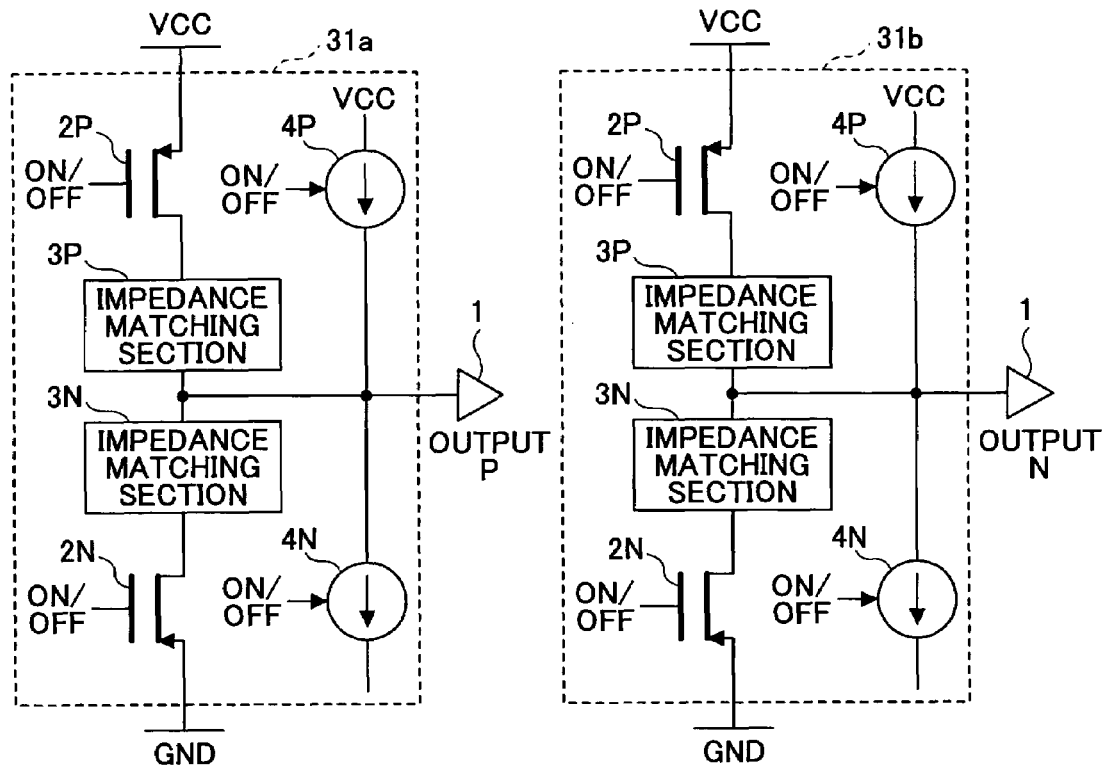
FIG. 15 is a schematic circuit diagram illustrating an example of a differential output circuit for performing signal transmission with two output systems, or normal output and inverting output systems.

FIG. 15 is a schematic circuit diagram illustrating an example of a differential output circuit equipped with the above-described output device and configured to perform signal transmission with two output systems, normal output and inverting output systems. In the differential output circuit, output circuits 31a and 31b having the same configuration are provided as shown in FIG. 15. The output circuits 31a and 31b are different only in output polarities. For example, the output circuit 31a is assigned to output a positive output P from its output terminals 1, whereas the output circuit 31b is assigned to output a negative output N from its output terminal 1.

Figure 16:
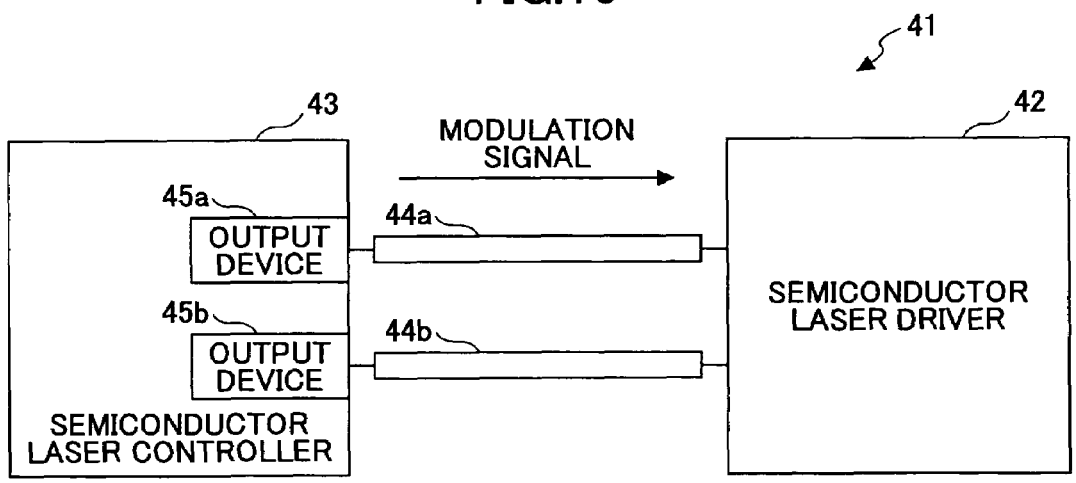
FIG. 16 is a schematic block diagram illustrating an example of a semiconductor laser modulation drive device.

FIG. 16 is a schematic block diagram illustrating an example of a semiconductor laser modulation drive device 41 equipped with the above-described output devices. The semiconductor laser modulation drive device 41 comprises, for example, a semiconductor laser driver 42 for causing a semiconductor laser (not shown) to emit laser beams, and a semiconductor laser controller 43 for outputting modulation signals corresponding to image data to the semiconductor laser driver 42. The semiconductor laser driver 42 and the semiconductor laser controller 43 comprise, for example, IC chips, and are interconnected through transmission lines 44a and 44b for signal transmission therebetween.

Output devices 45a and 45b having the configuration of the above-described output device (or the differential output circuits 31a and 31b of the differential output device) are provided between an output section of the semiconductor laser controller 43 and the transmission lines 44a and 44b.

With this configuration, the semiconductor laser controller 43 can accurately transmit modulation signals to the semiconductor laser driver 42 at high speed with reduced reflection.

Figure 17:
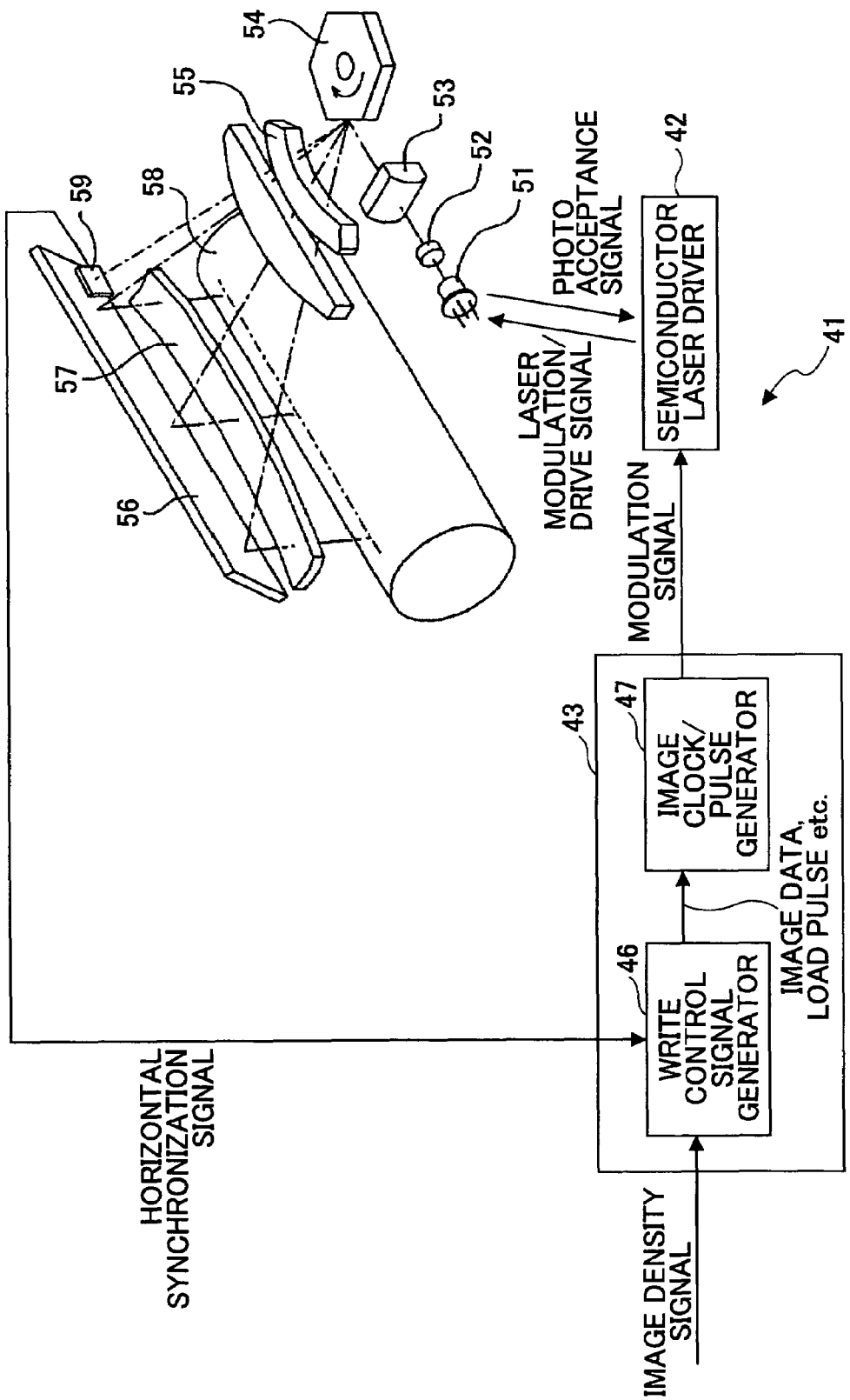
FIG. 17 is a perspective view of an image forming apparatus having a raster-scan write system illustrated together with a configuration of a control system.

FIG. 17 is a perspective view of an image forming apparatus, to which the output device is applied, having a raster-scan write system illustrated together with a configuration of a control system. A semiconductor laser 51 is provided that emits a modulated and controlled laser beam according to a laser modulation/drive signal. The laser beam from the semiconductor laser 51 is collimated by a collimator lens 52. After being shaped by a cylinder lens 53, the laser beam is incident on one of mirror faces of a polygon mirror 54. Along with a high speed rotation of the polygon mirror 54, the laser beam is deflected and scanned in a main scan direction to irradiate a surface of a rotating photoreceptor 58 through an fθ lens 55, a reflection mirror 56, a toroidal lens 57, and so on. When the photoreceptor 58, which has been uniformly charged, is irradiated by the deflection scanning of the laser beam, an electrostatic latent image is formed. The image is made into a toner image which is transferred onto transfer paper through a development process and a transfer process.

In this example, the image forming apparatus configured as descried above comprises a semiconductor laser modulation drive device 41 including a semiconductor laser controller 43 and a semiconductor laser driver 42. The semiconductor laser controller 43 includes a write control signal generator 46 for generating image data and load pulses according to image density signals, and an image clock/pulse generator 47 for generating modulation signals based on image data. The semiconductor laser driver 42 is configured to output, in response to the modulation signals from the semiconductor laser controller 43, the laser modulation/drive signals to the semiconductor laser 51. A write start position in the main scan direction is detected by a horizontal synchronization sensor 59, and is input into the write control signal generator 46. LD modulation signals are output according to horizontal synchronization signals and image signals. Output devices 45a and 45b according to this embodiment of the present invention are installed in an output section of the semiconductor laser controller 43 comprising IC chips in a manner described above with reference to FIG. 16. Therefore, the modulation signals can be accurately transmitted at high speed with reduced reflection.

While the output device of this embodiment of the present invention is applied to the image forming apparatus in the above description, the output device may be applied to an electronic device provided with integrated circuits (IC chips) for controlling its components and configured to transmit electrical signals between the integrated circuits through a transmission line. Specifically, the output device is installed in an output section of the integrated circuit. Other than electronic devices provided with integrated circuits (IC chips), the output device is also applicable to an electronic device provided with printed circuit boards (PCBs) for controlling its components and configured to transmit electrical signals between the PCBs through a transmission line. Specifically, the output device is installed in an output section of the PCB.

According to another aspect of the present invention, there is provided an impedance matching device installed in a transmitter section or a receiver section of an integrated circuit used for high-speed electrical signal transmission, adapted to control an output impedance or an input impedance, and comprising a resistor, an impedance matching transistor, and an operational amplifier.

The following section describes preferred embodiments according to this aspect of the present invention with reference to FIG. 18 through FIG. 27. While the present invention is described in terms of preferred embodiments, it should be understood that the invention is not limited thereto. In FIG. 18 through FIG. 27, while termination with respect to ground GND is illustrated, the same effects can be obtained in the case where termination with respect to a supply voltage is employed.

Second Embodiment

Figure 18:
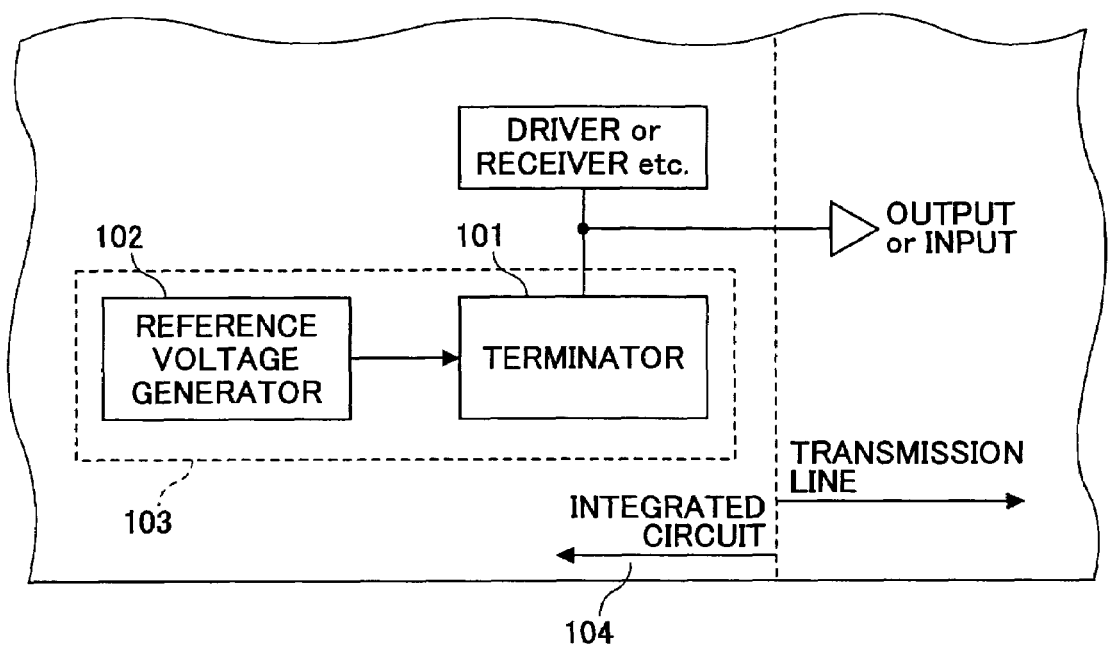
FIG. 18 is a conceptual diagram illustrating an impedance matching device according to a second embodiment.

FIG. 18 is a conceptual diagram illustrating an impedance matching device 103 according to a second embodiment. With reference to FIG. 18, the impedance matching device 103 of this embodiment is provided in an output section or an input section of an integrated circuit 104, and comprises a terminator 101, and a reference voltage generator 102 for controlling the terminator 101. The terminator 101 includes a resistor 105 and a transistor 106 (FIG. 19) as described below. The reference voltage generator 102 generates a reference voltage using an operational amplifier.

Figure 19:
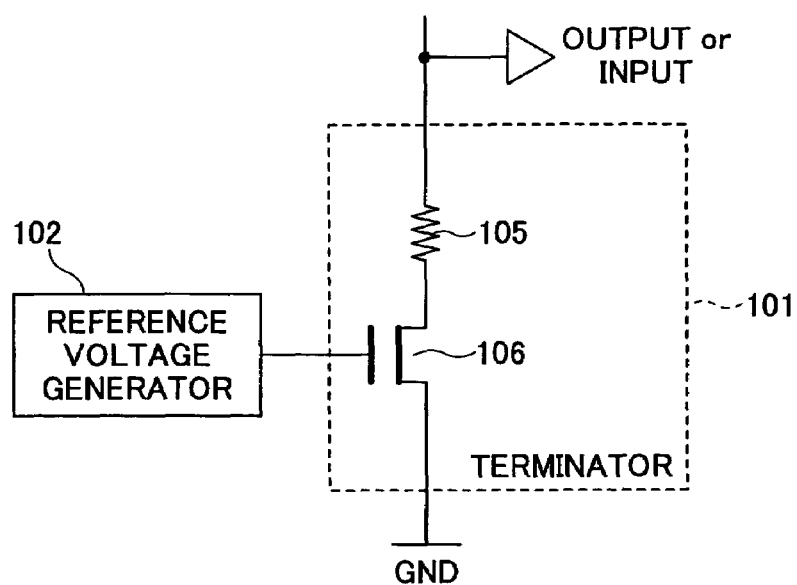
FIG. 19 is a detailed view of a terminator of the impedance matching device according to the second embodiment.

FIG. 19 is a detailed view of the terminator 101 of FIG. 18. As shown in FIG. 19, the terminator 101 includes the resistor 105 and the transistor 106, which are connected in series. The transistor 106 operates within a range of Vds<Vgs-Vth (transistor linear region), where Vgs is a gate voltage, Vds is a drain-source voltage, and Vth is a threshold voltage. In this light, the transistor 106 can be considered as a variable resistor. It is possible to match a combined resistance of the resistor 105 and the transistor 106 to the characteristic impedance of a transmission line by controlling the gate voltage of the transistor 106 by the reference voltage generator 102.

Figure 20:
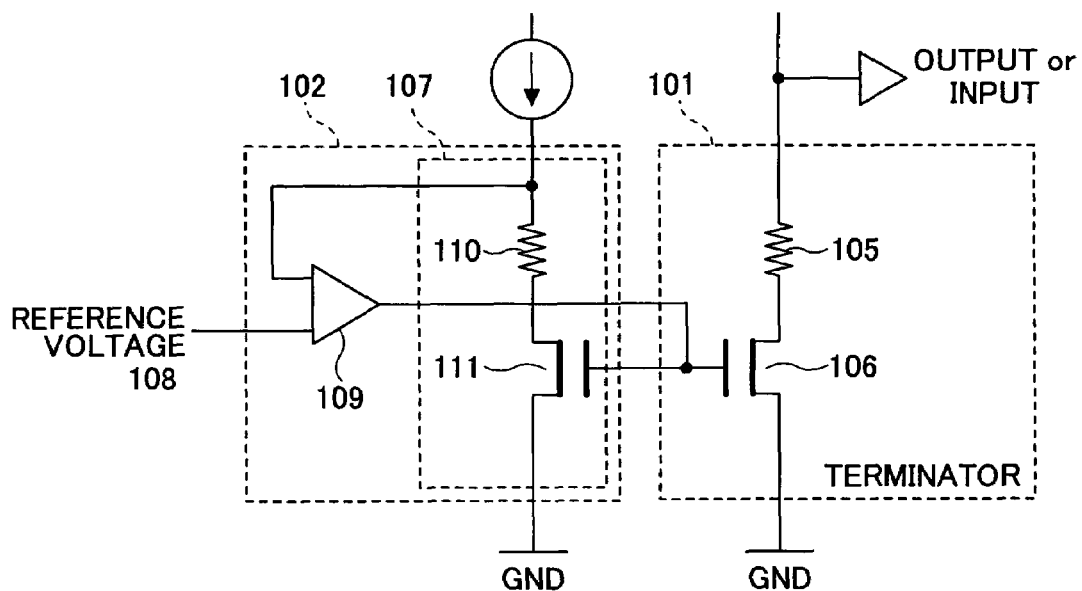
FIG. 20 illustrates a detailed configuration of a reference voltage generator of the impedance matching device according to the second embodiment.

FIG. 20 illustrates the detailed configuration of the reference voltage generator 102 of FIG. 18. With reference to FIG. 20, a dummy circuit section 107 having the same configuration as the terminator 101 is provided in the reference voltage generator 102. An operational amplifier 109 controls an output voltage when a predetermined current is applied to the dummy circuit section 107 so as to match the output voltage to a reference voltage 108 determined by the characteristic impedance of the transmission line and the value of the current from a current source. In the actual circuit layout, by arranging the terminator 101 and the dummy circuit section 107 close to and symmetric to each other, a device variation between the terminator 101 and the dummy circuit section 107 is minimized. Thus, the actual output impedance or the input impedance is matched to the characteristic impedance of the transmission line. In FIG. 20, by making the resistance of a resistor 110 and the transistor size of a transistor 111 in the dummy circuit section 107 different from the resistance of the resistor 105 and the transistor size of the transistor 106 in the terminator 101, respectively, such that the combined resistance of the dummy circuit section 107 becomes greater than the combined resistance of the terminator 101, the value of current from the constant current source can be reduced. That is, the consumption current of the dummy circuit section 107 can be reduced. In this case, the ratio between the resistance of the resistor 110 of the dummy circuit section 107 and the source-drain resistance of the transistor 111 in the dummy circuit section 107 is set to be equal to the ratio between the resistance of the resistor 105 and the source-drain resistance of the transistor 106 in the terminator 101. Having the dummy circuit section 107 allows controlling the output impedance or the input impedance of a transmitter section and a receiver section of an integrated circuit used for high-speed signal transmission. Therefore, high-speed operations are achieved without putting a high load on the output and input.

Third Embodiment

Figure 21:
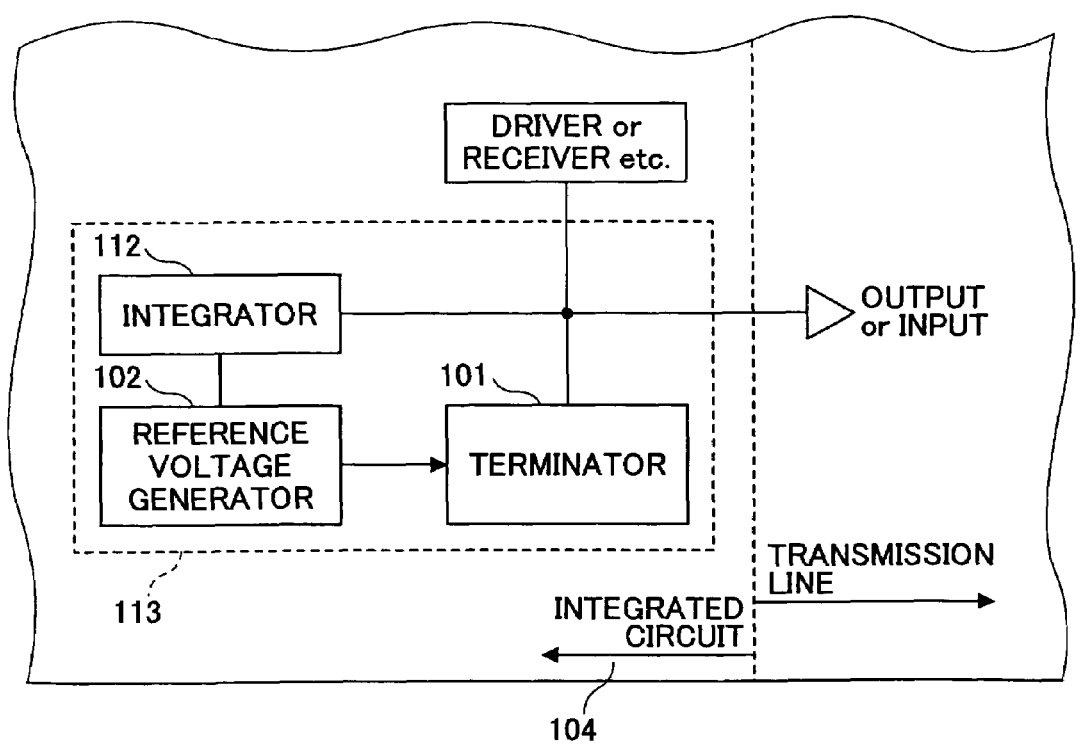
FIG. 21 is a conceptual diagram illustrating an impedance matching device according to a third embodiment.

FIG. 21 is a conceptual diagram illustrating an impedance matching device 113 according to a third embodiment. With reference to FIG. 21, an integrator 112 is connected to an output terminal/input terminal. A reference voltage generator 102 controls a terminator 101 by the output voltage of the integrator 112. The integrator 112 calculates the average of the input/output voltage, and the reference voltage generator 102 generates a reference voltage based on the average. Therefore, real-time control suitable for a transmission line and other environments can be performed. According to this embodiment, real-time impedance matching can be achieved with a simple configuration by averaging the output/input voltage.

Figure 22:
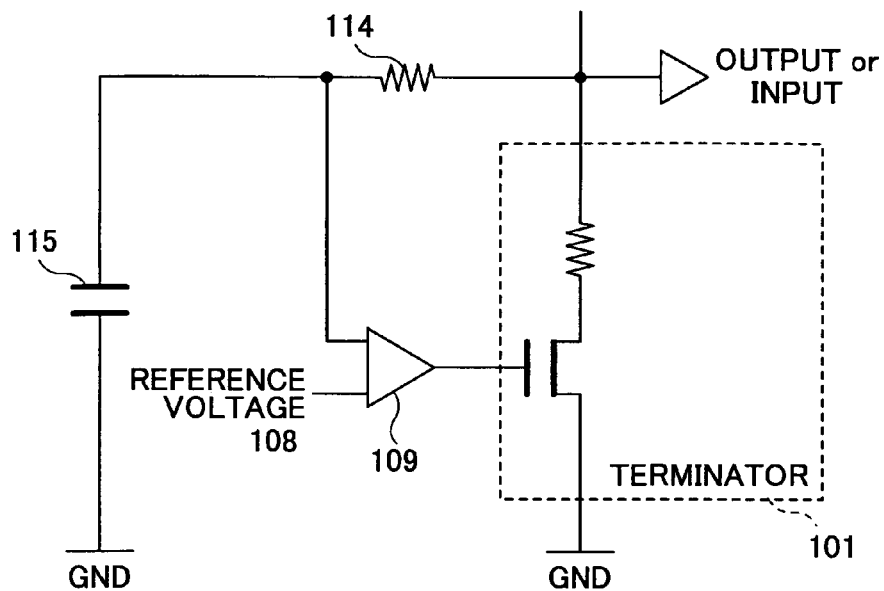
FIG. 22 is a circuit diagram illustrating the impedance matching device according to the third embodiment.

FIG. 22 is a circuit diagram of the impedance matching device 113 of this embodiment. A resistor 114 and a capacitor 115 connected to the input/output terminal form a lowpass filter, and its voltage is compared to the reference voltage 108. The operational amplifier 109 controls the terminator 101.

Fourth Embodiment

Figure 23:
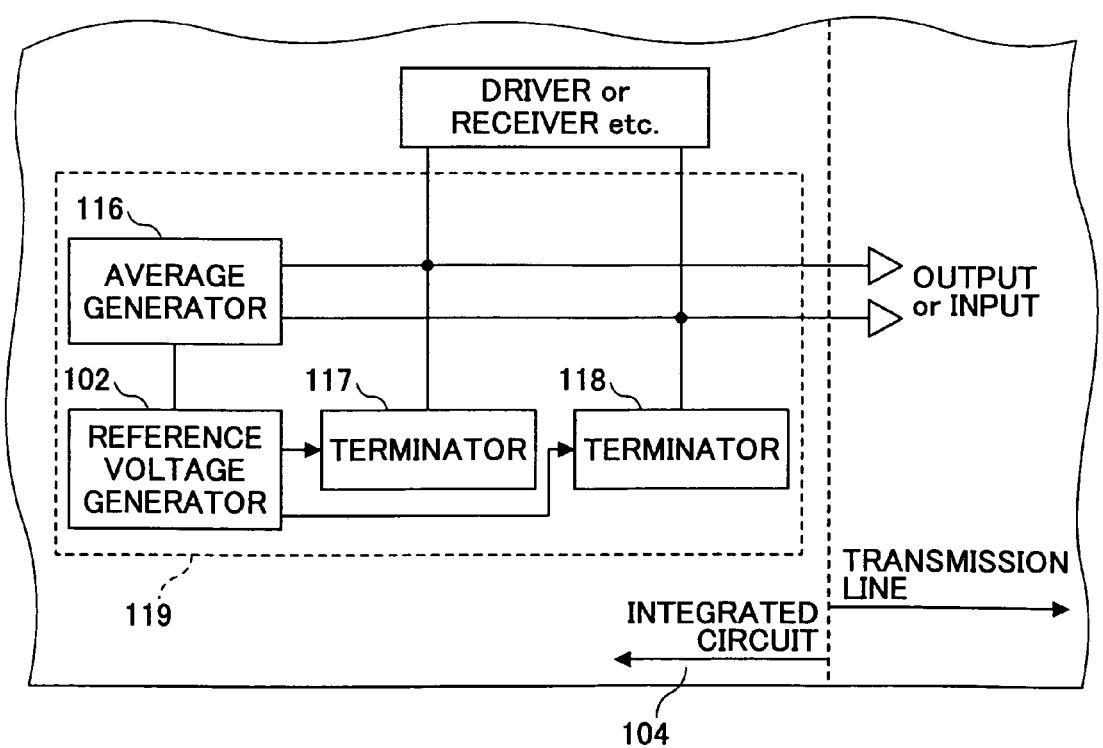
FIG. 23 is a conceptual diagram illustrating an impedance matching device according to a fourth embodiment.

FIG. 23 is a conceptual diagram illustrating an impedance matching device 119 according to a fourth embodiment of the present invention. With reference to FIG. 23, the impedance matching device 119 is designed for differential transmission. An average generator 116 is connected to input/output terminals. Based on the average calculated by the average generator 116, the reference voltage generator 102 controls terminators 117 and 118. The average generator 116 calculates the average of the differential input/output voltages, and the reference voltage generator 102 generates a reference voltage based on the average. Therefore, real-time control suitable for a transmission line and other environments can be performed. According to this embodiment, in differential transmission, real-time impedance matching can be achieved with a simple configuration by averaging the output/input voltages.

Figure 24:
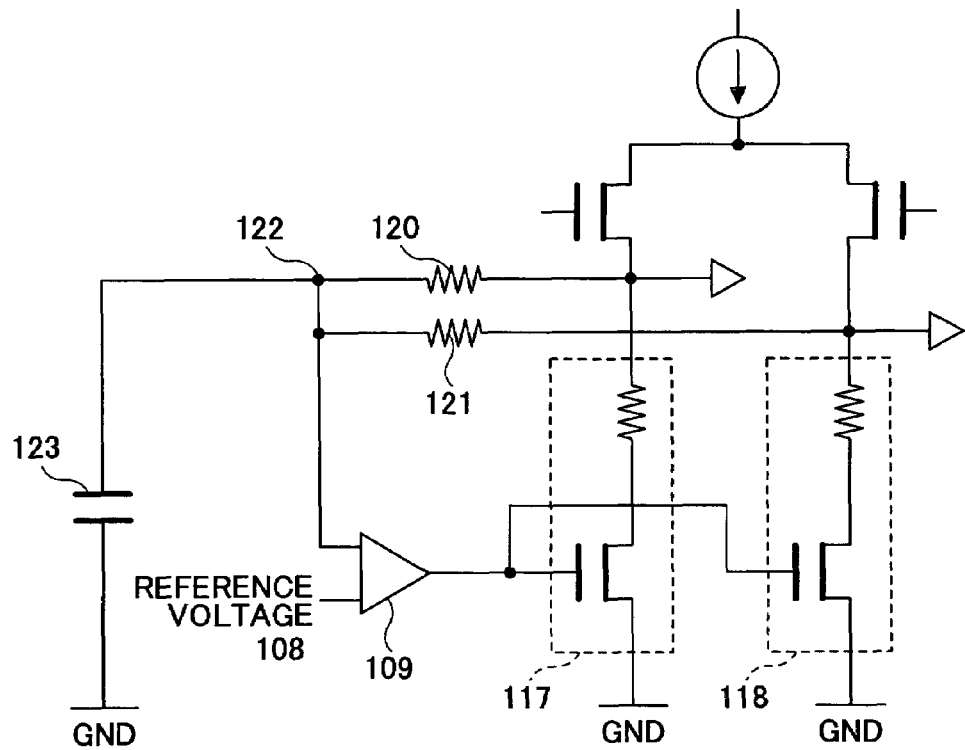
FIG. 24 is a circuit diagram illustrating the impedance matching device according to the fourth embodiment.

FIG. 24 is a circuit diagram of the impedance matching device 119. The differential outputs/input terminals are interconnected through two resistors 120 and 121, and a midpoint 122 is connected to ground GND through a capacitor 123. The midpoint 122 is the average of the differential outputs/inputs. The average is compared to the reference voltage 108. The operational amplifier 109 controls the terminators 117 and 118.

Fifth Embodiment

Figure 25:
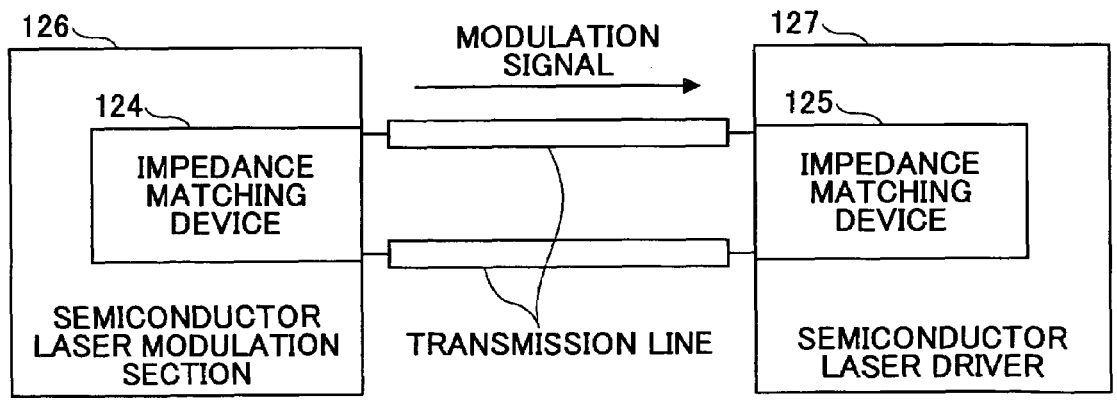
FIG. 25 is a block diagram illustrating a semiconductor laser drive modulation device equipped with any one of the impedance matching devices of the second-fourth embodiments according to a fifth embodiment.

A semiconductor laser drive modulation device according to a fifth embodiment is equipped with any one of the impedance matching devices 103, 113, and 119 of the second-fourth embodiments. FIG. 25 shows a configuration of the semiconductor laser drive modulation device equipped with impedance matching devices 124 and 125 having the same configuration as any one of the impedance matching devices 103, 113, and 119 of the second-fourth embodiments. In the semiconductor drive modulation device, if each of a semiconductor laser drive section 127 and a semiconductor laser modulation section 126 comprises an independent integrated circuit, signal transmission between the integrated circuits is required. By providing the impedance matching devices 124 and 125 in an input section of the semiconductor laser drive section 127 and/or an output section of the laser modulation section 126, signals can be accurately transmitted at high speed with reduced reflection.

Figure 26:
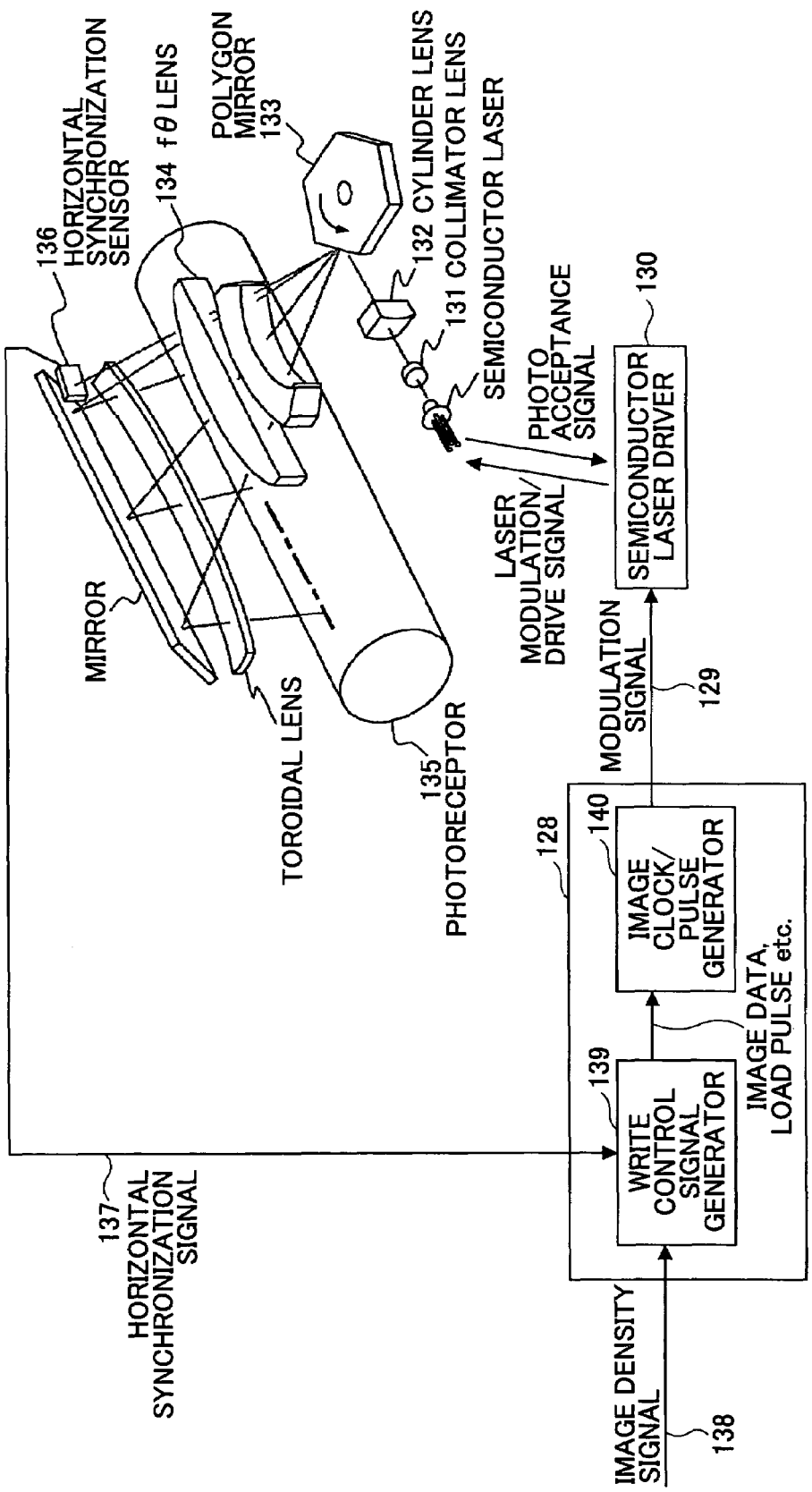
FIG. 26 is a schematic diagram illustrating a system configuration of the semiconductor laser drive modulation device according to the fifth embodiment.

FIG. 26 is a schematic diagram illustrating a system configuration of a raster-scan image forming apparatus equipped with the semiconductor laser drive modulation device of this embodiment. An LD modulation signal 129 generated by an LD modulation signal generator 128 is input to a semiconductor laser drive section 130 so as to modulate the beam of a semiconductor laser. The modulated laser beam is made incident on a polygon mirror 133 through a collimator lens 131 and a cylinder lens 132. After being deflected by the polygon mirror 133, the beam enters on a photoreceptor 135 through an fθ lens 134. A write start position is detected by a horizontal synchronization sensor 136, and is input into the image processor/LD modulation signal generator 128. LD modulation signals 129 are output according to horizontal synchronization signals 137 and image signals 138. Because FIG. 26 illustrates a system configuration, a write control signal generator 139 of FIG. 26, which has a function for generating write control signals and a function as a counter in a main scan direction and a sub scan direction, not only a function for generating image data, is not illustrated as an image data generator but illustrated as a write control signal generator. In FIG. 26, for example, an impedance matching device is applicable in transmission of modulation signals from an image clock generator/pulse generator 140 to the semiconductor laser drive section 130. In this case, modulation signals can be accurately transmitted at high speed with reduced reflection.

Sixth Embodiment

An image forming apparatus according to a sixth embodiment of the present invention is equipped with any one of the impedance matching devices 103, 113, and 119 of the second-fourth embodiments or the semiconductor laser drive modulation device of the fifth embodiment. The configuration and functions of the image forming apparatus of this embodiment are described with reference to FIG. 27. The image forming apparatus is a multi-function digital image forming apparatus having, for example, a function for making a copy of images of a document, a facsimile function for transmitting image data via a communication line, and a printer function for printing out images based on image data provided from external devices via an external I/F.

Figure 27:
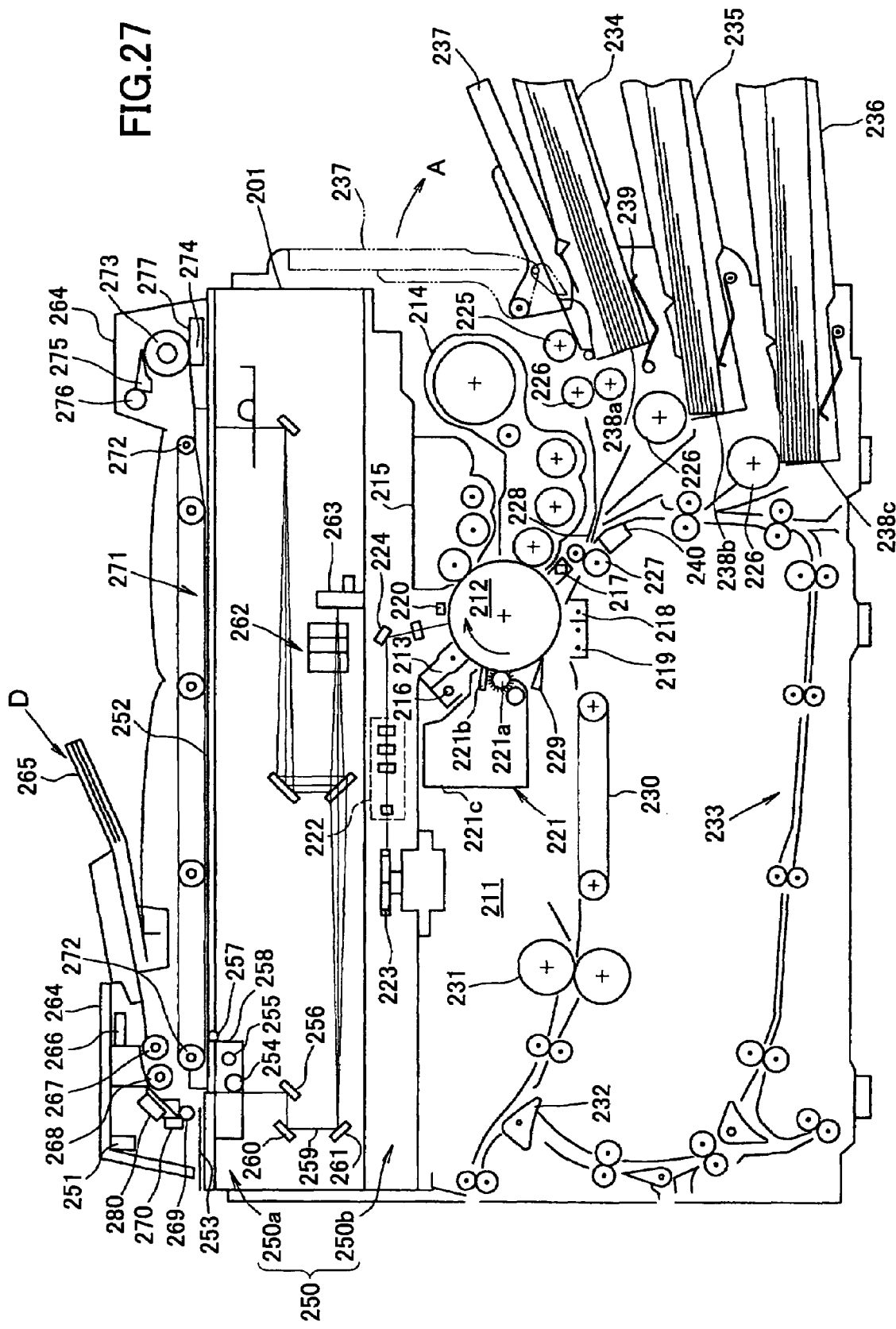
FIG. 27 is a cross-sectional view of an example of an image forming apparatus equipped with any one of the impedance matching devices of the second-fourth embodiments according to a sixth embodiment.

FIG. 27 is a schematic cross-sectional view illustrating the internal structure of an example of the image forming apparatus. With reference to FIG. 27, an electrophotographic digital image forming apparatus 250, which is an example of the image forming apparatus of this embodiment, comprises a scanner section 250a or an image reading section serving as a reading unit for reading images of a document and generating image data, and a printer section 250b or an image forming section serving as an image forming unit for forming images based on the image data. The image forming apparatus 250 further comprises a document auto-feeder 251 serving as a feeding unit on the upper side of the scanner section 250a. The document auto-feeder 251 has an open position and a closed position with respect a document table 252 (to be described below in detail), and is configured to feed a document D, which is to be read, to the document table 252 one by one. The document auto-feeder 251 also serves to press the document D placed on the document table 252 onto the document table 252.

The scanner section 250a includes the document table 252 made of transparent glass on which the document D is placed and being opposed by the document auto-feeder 251 located in the closed position, and a document scale 253 arranged along an edge of the document table 252 for indicating a position on the document table 252 where the document D is to be placed.

Under the document table 252, there are provided an exposure lamp 254 to illuminate the document D placed on the document table 252, an auxiliary reflector plate 258 for focusing a light beam from the exposure lamp 254 onto the document D, and a first mirror 256 for bending a reflection beam from the document D to the left side in FIG. 27. The exposure lamp 254, the auxiliary reflector plate 258, and the first mirror 256 are fixed to a first carriage 257 so as to be moved in parallel to the document table 252 as the first carriage 257 is moved. The first carriage 257 is moved in parallel to the document table 252 by a driving force of a pulse motor (not shown) transferred through a toothed belt (not shown) and the like.

A second carriage 259 is disposed at the left side (in FIG. 27) of the document table 252, i.e., in a direction in which a reflection beam reflected by the document table 252 is guided. The second carriage 259 has a second mirror 260 that bends the reflection beam from the document D guided by the first mirror 256 to the lower side, and a third mirror 261 that is arranged at a right angle to the second mirror 260 and bends the reflection beam from the second mirror 260 to the right side in FIG. 27. The second carriage 259 is moved by the toothed belt (not shown), which drives the first carriage 257, in parallel to the document table 252 along with the movement of the first carriage 257 at half the speed of the first carriage 257.

Under the carriage 257 within a plane including an optical axis of a beam bent through the second carriage 259, there are provided an imaging lens 262 for forming an image with the reflected beam from the second carriage 259 at a predetermined magnification, and a line sensor 263 including plural CCD image sensors for converting the reflection beam focused by the imaging lens 262 into electrical signals, or image data.

The main scan direction referred herein indicates a direction in which the CCD image sensors of the line sensor 263 are arranged, while the sub scan direction indicates a direction in which the first carriage 257 and the second carriage 259 are moved. A read system of the image forming apparatus of this embodiment is configured as a sheet through type image read system in which images of the document D are read while the document auto-feeder 251 feeds the document D with respect to the fixed scanner section 250a.

The printer section 250b has the following configuration. The printer section 250b comprises a photosensitive drum 212, an electrostatic charger 213, development units 214 and 215, an electricity removing lamp (PTL) 217, a transfer charger 218, a separation charger 219, an eraser 220, a cleaning unit 221, a polygon mirror (laser beam generator) 222, and an optical system (lenses) 223. The printer section 250b forms and outputs an image based on image data held in an image memory.

More specifically, the photosensitive drum 212 is rotated in the direction indicated by an arrow in FIG. 27. Simultaneously, the electricity removing lamp (QL) 216, the electricity removing lamp (PTL) 217 used before transferring, the transfer charger 218, the separation charger 219, the eraser 220, and the cleaning unit 221 are driven so that a surface potential of the photosensitive drum 212 that has passed through the electricity removing lamp 216 becomes approximately zero while preventing toner remaining on the photosensitive drum 212 and nonuniform potential from reaching the electrostatic charger 213 and the development units 214 and 215.

After that, the electrostatic charger 213 uniformly charges the surface of the photosensitive drum 212, and the image data held in the image memory are read out. In accordance with the read image data, a laser beam is projected from a semiconductor laser (not shown). The laser beam projected from the semiconductor laser is condensed by a cylinder lens (not shown) so as to enter into the polygon mirror (laser beam generator) 222 for spin scan. Then, the reflected beam illuminates the surface of the photosensitive drum 212 through the optical system (lenses) 223 and the mirror 224 to form an electrostatic latent image.

Then, potential in a non-image portion (excess portion extending out of the image forming area) of the latent image formed on the photosensitive drum 212) is removed by the eraser 220, and the image is developed by transferring toner with use of the black-and white development unit 214 that develops with a black toner or with use of the color development unit 215 that develops with a color toner. The density of the image can be adjusted by changing the development bias potential.

In the meantime, a calling roller 225 and any one of three paper feed rollers 226 are driven by switching ON a paper feed clutch that selectively drives a main motor (not shown) such that a recording sheet stored in a selected feed tray (to be described below) is fed to a resting pair of resist rollers 227. A resist sensor 228 is disposed in front of the pair of resist rollers 227. The resist sensor 228, which may be a reflective photosensor, turns on when an end of the recording sheet reaches an opposing position. After a predetermined time has passed, the paper feed clutch is switched back to an OFF state to stop transporting the recording sheet.

The timing of switching OFF the paper feed clutch is longer than the time that the recording sheet is transported between the resist sensor 228 and the pair of resist rollers 227. Therefore, the recording sheet waits with the front end abutting the pair of resist rollers 227 and with the front side being bent, generating a force thereby preventing a skew. Then, the paper feed clutch is switched back to the ON state such that the front end of the image on the photosensitive drum 212 is aligned with the front end of the sheet. Thus, the waiting recording sheet is transported to the transfer section by the rotation of the pair of resist rollers 227.

When the recording sheet reaches the transfer section, the toner image on the photosensitive drum 212 is transferred onto the surface of the sheet by the transfer charger 218. Then, the charge potential on the sheet surface is lowered by the separation charger 219 integrally held together with the transfer charger 218, so that the adhesion between the recording sheet and the photosensitive drum 212 is lowered. After that, the recording sheet is separated from the surface of the photosensitive drum 212 by a separation claw 229.

Then, the recording paper is transported to a fixing section by a transport belt 230 extending around two rollers, so a fixing roller 231 fixes the toner image with heat. If a selected copy mode is two-side printing, the paper is transported to a paper re-feed path at the lower side by switching the separation claw 232.

The remaining toner on the photosensitive drum 212 after the image transferring is removed by a cleaning brush 221a and a cleaning blade 221b of the cleaning unit 221 and collected into a toner collecting tank 221c. Further, the photosensitive surface is exposed by the electricity removing lamp 216 for removing remaining potential.

This image forming apparatus includes three detachable paper feed cassettes 234 through 236 for different sizes of paper, in each of which sheets with a predetermined size are stored, and a manual paper feed table (manual paper feed tray) 237 for paper with a special size that does not correspond to any of the paper feed cassettes 234 through 236.

In the case where a recording sheet in any one of the paper feed cassettes 234 through 236 is used for copying, a cassette size is selected using a size selecting key on an operations panel (not shown). Then, a copy start key is pressed, so a recording sheet is fed from the paper feed cassette of the selected size.

The size of the sheets in the paper feed cassettes 234 through 236 are detected by size detection sensors 238a through 238c, each including, for example, five serial photo interrupters. A light shielding plate (not shown) for size identification is attached to a front part of each of the paper feed cassettes 234 through 236. The light-shielding plate includes different notches for different sizes of recording paper that can be stored in the cassettes 234 through 236.

When the paper feed cassettes 234 through 236 are attached, an optical path of only the photo interrupter facing a light shielding section of the shielding plate is interrupted. The size detection sensor 238a through 238c output signals (codes) corresponding to the interrupted state to a control section. The control section includes a CPU. In the case where a special size recording sheet is used for copying, the manual paper feed table 237 is opened from a closed position indicated by a chain double-dashed line in FIG. 27 to a use position indicated by a solid lien in a direction indicated by an arrow A, and a desired recording sheet is placed on an upper surface of the manual paper feed table 237. When the copy start key is pressed, the recording sheet is fed from the manual paper feed table 237.

When the manual paper feed table 237 is rotated to the use position, a bottom plate lift arm provided for the first paper feed cassette 234 for lifting a bottom plate on which the recording sheet is placed is lowered. An open/close detection sensor (not shown) for detecting whether the manual paper feed table 237 is opened is provided at a position opposing the manual paper feed table 237 of the image forming apparatus.

The present application is based on Japanese Priority Applications No. 2004-243447 filed on Aug. 24, 2004 and No. 2004-309513 filed on Oct. 25, 2004, with the Japanese Patent Office, the entire contents of which are hereby incorporated by reference.

What is claimed is:

1. An output device that outputs a transmission signal to a transmission line, comprising:
  an impedance matching section including an impedance adjustment section, and a dummy circuit section having the same configuration as the impedance adjustment section and adapted to calculate an adjustment value for matching an output impedance to a characteristic impedance of the transmission line, the impedance matching section being configured to set the adjustment value calculated by the dummy circuit section to the impedance adjustment section to match the output impedance to the characteristic impedance;
  a switching transistor connected in series to the impedance matching section and configured to be turned on/off so as to switch an output between an H level and an L level; and a constant current driver configured to add a constant current to the output.

2. The output device as claimed in claim 1, wherein the impedance adjustment section includes a variable resistance section to adjust a combined resistance.

3. The output device as claimed in claim 2, wherein the variable resistance section includes a plurality of resistors and a plurality of transistors.

4. The output device as claimed in claim 3, wherein the resistors are connected in parallel, and the variable resistance section is configured to adjust a combined impedance to a desired impedance by selecting the resistors with switching on/off the transistor.

5. The output device as claimed in claim 2, wherein the variable resistance section includes a resistor and a transistor connected in series to the resistor and is configured to adjust a combined impedance to a desired impedance by adjusting a gate voltage of the transistor.

6. The output device as claimed in claim 2, wherein the dummy circuit section includes:
   a dummy variable resistance section having the same configuration and size as the variable resistance section;
   a dummy transistor having the same configuration and size as the switching transistor and connected in series to the dummy variable resistance section;
   a dummy current source that applies a current to the series-connected dummy variable resistance section and dummy transistor; and
   a comparator configured to compare an output voltage at the time of applying the current to the series-connected dummy variable resistance section and dummy transistor to a reference voltage.

7. The output device as claimed in claim 2, wherein the dummy circuit section includes:
   a dummy variable resistance section having the same configuration as, but a different size from, the variable resistance section;
   a dummy transistor having the same configuration as, but a different size from, the switching transistor and connected in series to the dummy variable resistance section;
   a dummy current source that applies a current to the series-connected dummy variable resistance section and dummy transistor; and
   a comparator configured to compare an output voltage at the time of applying the current to the series-connected dummy variable resistance section and dummy transistor to a reference voltage.

8. The output device as claimed in claim 2, wherein the dummy circuit section includes:
   a dummy variable resistance section having the same configuration and size as the variable resistance section;
   a dummy transistor having the same configuration and size as the switching transistor and connected in series to the dummy variable resistance section;
   a dummy current source that applies a current to the series-connected dummy variable resistance section and dummy transistor; and
   an operational amplifier adapted to adjust a resistance of the dummy variable resistance section.

9. The output device as claimed in claim 2, wherein the dummy circuit section includes:
   a dummy variable resistance section having the same configuration as, but a different size from, the variable resistance section;
   a dummy transistor having the same configuration as, but a different size from, the switching transistor and connected in series to the dummy variable resistance section;
   a dummy current source that applies a current to the series-connected dummy variable resistance section and dummy transistor; and
   an operational amplifier adapted to adjust a resistance of the dummy variable resistance section.

10. The output device as claimed in claim 1, wherein the constant current driver supplies a constant current to an output terminal connected to the transmission line from a supply voltage.

11. The output device as claimed in claim 1, wherein the constant current driver draws a constant current to ground from an output terminal connected to the transmission line.

12. The output device as claimed in claim 1, wherein the constant current driver supplies a constant current to an output terminal connected to the transmission line from a supply voltage, or draws a constant current from the output terminal to ground.

13. The output device as claimed in claim 1, wherein the constant current driver is switched between an ON state for generating the constant current and an OFF state for not generating the constant current.

14. The output device as claimed in claim 13, wherein the constant current driver is switched between the ON state and the OFF state at the moment when the switching transistor switches the output between the H level and the L level.

15. The output device as claimed in claim 1, wherein data transmission is performed in accordance with an on/off control of the switching transistor, and an Emphasis and de-Emphasis function is performed in accordance with the constant current of the constant current driver.

16. The output device as claimed in claim 1, wherein the constant current driver changes a value of the constant current to be generated.

17. A differential output device that performs signal transmission with a positive output and a negative output, comprising:
   the output device of claim 1 for each of the positive output and the negative output.

18. A semiconductor laser modulation drive device, comprising:
   a semiconductor laser drive unit and a semiconductor laser modulation unit each including a chip;
   wherein the semiconductor laser modulation unit includes the output device of claim 1 to transmit electrical signals between the semiconductor laser modulation unit and the semiconductor laser drive unit.

19. A semiconductor laser modulation drive device, comprising:
   a semiconductor laser drive unit and a semiconductor laser modulation unit each including a chip;
   wherein the semiconductor laser modulation unit includes the differential output device of claim 17 to transmit electrical signals between the semiconductor laser modulation unit and the semiconductor laser drive unit.

20. An image forming apparatus, comprising:
   a semiconductor laser adapted to perform optical writing to form an electrostatic latent image on a photoreceptor; and
   the semiconductor laser modulation drive device of claim 18 to drive the semiconductor laser.

21. An image forming apparatus, comprising:
a semiconductor laser adapted to perform optical writing to form an electrostatic latent image on a photoreceptor; and
the semiconductor laser modulation drive device of claim 19 to drive the semiconductor laser.

22. An electronic device, comprising:
integrated circuits or printed circuit boards to control elements of the electronic device; and
the output device of claim 1 to transmit electrical signals between the integrated circuits or between the printed circuit boards.

23. An electronic device, comprising:
integrated circuits or printed circuit boards to control elements of the electronic device; and
the differential output device of claim 17 to transmit electrical signals between the integrated circuits or between the printed circuit boards.

24. A semiconductor laser modulation drive device, comprising:
a semiconductor laser drive unit; and
a semiconductor laser modulation unit;
wherein if the semiconductor laser drive unit and the semiconductor laser modulation unit each includes a chip, the impedance matching device of claim 23 is used for signal transmission between the semiconductor laser drive unit and the semiconductor laser modulation unit.

25. An image forming apparatus, comprising:
the impedance matching device of claim 23 for signal transmission between chips or between boards in the image forming apparatus.

26. An impedance matching device adapted to control an output impedance or an input impedance in a transmitter section or a receiver section of an integrated circuit used for high-speed electrical signal transmission, the impedance matching device comprising:
a terminator including a resistor and an impedance matching transistor; and
a reference voltage generator including an operational amplifier;
wherein the operational amplifier controls a gate voltage of the impedance matching transistor to have a desired impedance, and
the reference voltage generator includes a dummy circuit section having the same circuit configuration as the terminator.

27. The impedance matching device as claimed in claim 26, wherein
the value of a resistance in the dummy circuit section is different from the value of a resistance in the terminator; and
the size of an impedance matching transistor in the dummy circuit section is different from the size of the impedance matching transistor in the terminator.

28. The impedance matching device as claimed in claim 26, wherein the reference voltage generator includes an integrator that integrates a voltage of an output terminal of the transmitter section or a voltage of an input terminal of the receiver section.

29. The impedance matching device as claimed in claim 26, wherein if a differential transmission is employed as a transmission system, the reference voltage generator includes an average generator that outputs an average value of a differential output and a differential input.

30. A semiconductor laser modulation drive device, comprising:
a semiconductor laser driver; and
a semiconductor laser modulation unit;
wherein if the semiconductor laser drive unit and the semiconductor laser modulation unit each includes a chip, the impedance matching device of claim 26 is used for signal transmission between the semiconductor laser drive unit and the semiconductor laser modulation unit.

31. An image forming apparatus, comprising:
the impedance matching device of claim 26 for signal transmission between chips or between boards in the image forming apparatus.

* * * * *